(12) United States Patent
Lin

(10) Patent No.: US 7,909,166 B2
(45) Date of Patent: Mar. 22, 2011

(54) FRONT OPENING UNIFIED POD WITH LATCH STRUCTURE

(75) Inventor: Chin-Ming Lin, Shulin (TW)

(73) Assignee: Gudeng Precision Industrial Co, Ltd, Shulin (TW)

( * ) Notice: Subject to any disclaimer, the term of this patent is extended or adjusted under 35 U.S.C. 154(b) by 20 days.

(21) Appl. No.: 12/191,367

(22) Filed: Aug. 14, 2008

(65) Prior Publication Data
US 2010/0038282 A1 Feb. 18, 2010

(51) Int. Cl.
*B65D 85/30* (2006.01)
*B65D 45/28* (2006.01)

(52) U.S. Cl. .................. 206/710; 206/454; 220/323

(58) Field of Classification Search .............. 206/710, 206/711, 454; 220/323–326; 292/32–37, 292/40–41
See application file for complete search history.

(56) References Cited

U.S. PATENT DOCUMENTS

| | | |
|---|---|---|
| 4,995,430 A | 2/1991 | Bonora et al. |
| 5,711,427 A | 1/1998 | Nyseth |
| 5,915,562 A | 6/1999 | Nyseth et al. |
| 5,931,512 A | 8/1999 | Fan et al. |
| 5,957,292 A | 9/1999 | Mikkelsen et al. |
| 6,622,883 B1 | 9/2003 | Wu et al. |
| 6,736,268 B2 | 5/2004 | Nyseth et al. |
| 6,880,718 B2 | 4/2005 | Eggum |
| 6,902,063 B2 | 6/2005 | Pai et al. |
| 7,168,587 B2 | 1/2007 | Eggum |
| 7,182,203 B2 | 2/2007 | Burns et al. |
| 2005/0173296 A1 | 8/2005 | Hyobu et al. |
| 2006/0283771 A1 | 12/2006 | Park |

*Primary Examiner* — Bryon P Gehman
(74) *Attorney, Agent, or Firm* — Ming Chow; Sinorica, LLC

(57) ABSTRACT

The wafer container includes a container body, which is disposed with a plurality of slots for receiving a plurality of wafers therein and an opening is formed by one sidewall of which for importing and exporting the plurality of wafers, and a door includes an outer surface and an inner surface, which is joined with the opening of the container body via the inner surface for protecting the plurality of wafers within the container body. A latch component is disposed in a platform of the inner surface of the door, which includes an oval cam, a pair of moving bars contacting two ends of the oval cam, at least a pair of roller disposed in the platform and each of roller fixed in a slide groove of each moving bar, and a locating spring being an integral part of each moving bar for controlling the turning of the oval cam to drive the each moving bar.

18 Claims, 24 Drawing Sheets

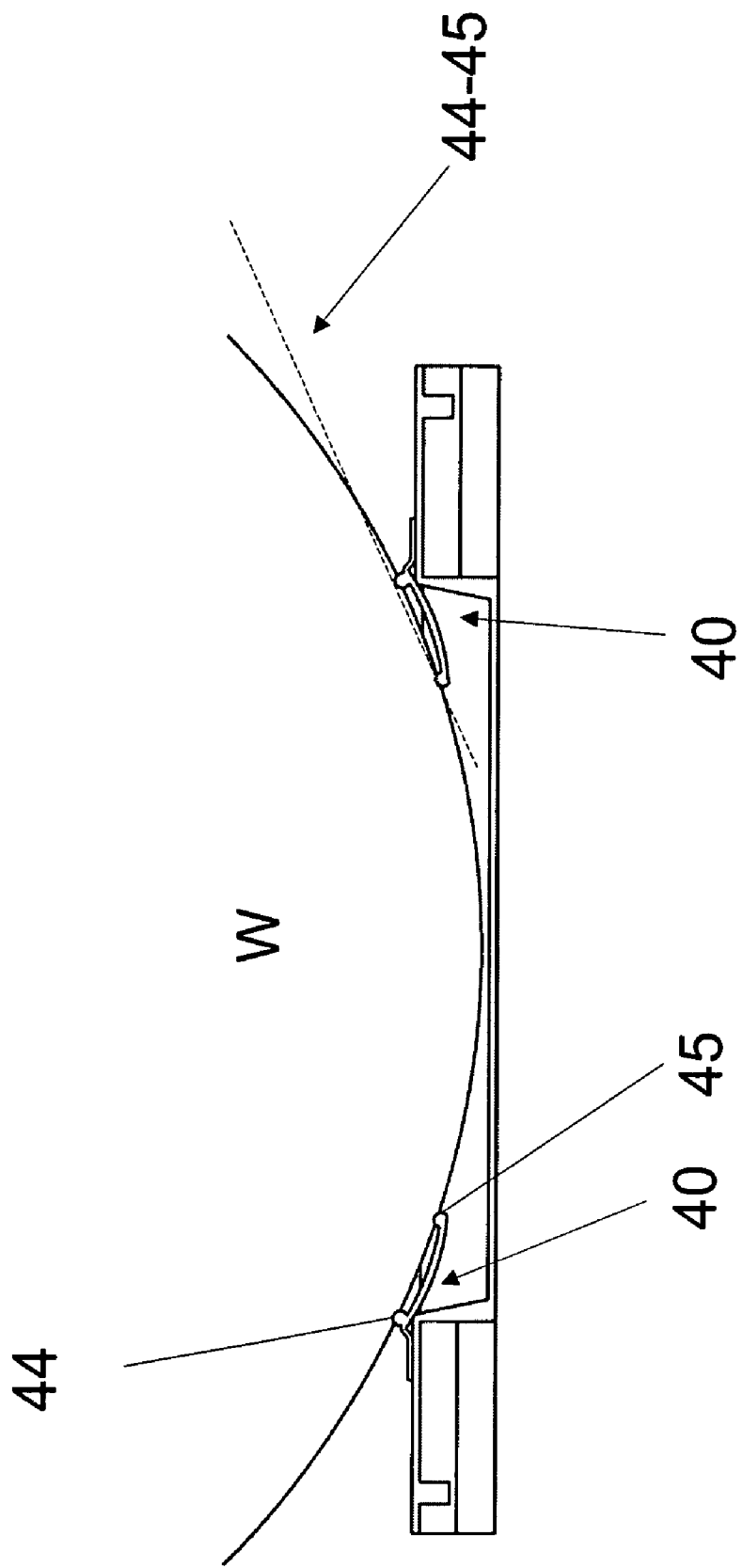

FRONT OPENING UNIFIED POD WITH LATCH STRUCTURE

BACKGROUND OF THE INVENTION

1. Field of the Invention

The present field of the invention is related to a wafer container, and more particularly, to a latch component disposed in door of wafer container.

2. Description of the Prior Art

The semiconductor wafers are transferred to different stations to apply the various processes in the required equipments. A sealed container is provided for automatically transferring to prevent the pollution occurring during transferring process. FIG. 1 shows the view of wafer container of the conventional prior art. The wafer container is a front opening unified pod (FOUP) which includes a container body 10 and a door 20. The container body 10 is disposed with a plurality of slots 11 for horizontally receiving a plurality of wafers, and an opening 12 is located on a sidewall of the container body 10 for importing and exporting. Further, the door 20 includes an outer surface 21 and an inner surface 22, in which the door 20 is joined with the opening 12 of the container body 10 via inner surface 22 to protect the plurality of wafers within the container body 10. Furthermore, at least one latch hole 23 is disposed on the outer surface 21 of the door 20 for opening or closing the wafer container. According to the aforementioned, due to the wafer is placed in the container body 10 horizontally, thus, the FOUP needs a wafer restraint component to prevent the vibration from displacement or from the movement toward the opening 12 of container body 10 occurring during the wafer transportation.

FIG. 2 is a view of a front opening unified pod (FOUP) as described in U.S. Pat. No. 6,736,268. As shown in FIG. 2, the inner surface 22 of the door 20 is disposed with a recess 24 and the recess 24 is extended from the top 221 of the inner surface 22 to the bottom 222, and is located between two latch components 230 (inside of the door 20). A wafer restraint module (not shown in Figure) is further disposed in the recess 24. The wafer restraint module consists two wafer restraint components 100, and each wafer restraint component 100 includes a plurality of wafer contact heads 110 to sustain corresponding wafers, so as to prevent the wafer from displacement or movement toward the door opening due to vibration occurring in the wafer transportation procedure. However, the above-mentioned wafer restraint module is disposed on the recess 24 of the inner surface 22 of the door 20, and the wafer is merely attached to the inner surface 22 of the door 20 or the wafer is partially settled down within the recess 24. The wafers either sit adjacent to the inner surface 22 of the door 20 or only slightly enter into the recess 24. As a result, the wafers are not securely and fully settled into the recess 24 in order to effectively shorten the length between the front side and the back side of the FOUP. In addition, the tiny dust particles generated due to the friction between the wafer restraint module and the wafers can be easily accumulated in the recess 24. In the process of cleaning the accumulated dust particles, it is necessary to separate the wafer restraint module from the recess 24 on the inner surface 22 of the door 20. By frequent separation and assembly of the wafer restraint module in order to apply the cleaning process, the wafer restraint module is easily slackened.

Furthermore, FIG. 3 is a view of latch component 230 in door 20 of a front opening unified pod (FOUP) as described in U.S. Pat. No. 5,711,427. The method for assembling the door 20 and container body 10 is mainly to dispose a movable bolts 231 on the two sides of door 20 (namely between the outer surface 21 and the inner surface 22) and to dispose a socket holes 13 adjacent to the edge of opening of door 20 and corresponding to bolts 231. The objective of fixing the door 20 in the container body 10 can thus be achieved with the turning of latch hole disposed on outer surface 21 of door 20 and the inserting of latch bolts 231 into socket holes 13, in which the insertion and withdrawal of latch bolts 231 are controlled by the turning of latch hole via a round-shaped cam 232.

And in the operating practice of semiconductor factory, the opening of FOUP is mainly operated through a wafer carrying apparatus (not shown in Figure). The wafer carrying apparatus includes at least one opening latch (not shown in Figure) that is to be inserted into the latch hole 23 on outer surface 21 of door 20 of the FOUP and to turn cam 232 to drive the movable bolts 231 to open or close the FOUP.

In addition, other U.S. patents that describe latch component in door of FOUP include U.S. Pat. Nos. 5,915,562, 5,957,292, 6,622,883, and 6,902,063. In order to achieve air tightness when joining door and container body, movable bolts will shift longitudinally for fastening a springy air-tight component, which leads to achievement of both objectives of closing FOUP and air tightness. However, in prior latch patents, complex mechanic apparatuses are used, which not only results in higher failure rate but also generates too much mechanical friction in the operating process that pollutes wafers. Moreover, the air tightness achieved by fastening springy air tight component with shift of movable bolts cannot sustain for very long time and is not effective enough.

Moreover, in conventional FOUP, some restraint components are disposed on the inner surface of door 20. Thus, when door 20 closes to the container body 10, the restraint components contact wafers and completely fix the wafers in order to prevent displacement of wafers in FOUP occurring during transportation procedure. In order to avoid forcible collision or friction between restraint components and wafers when the restraint components contact the wafers, therefore, as shown in FIG. 4, a few U.S. patents disclose the springy component 86 that is disposed between the cam 232 in latch component 230 and door 20. In the process, the cam 232 turns and drives movable bolts 231 to close FOUP, this springy component 86 can function as a damping for restraint component that disposed on inner surface of door 20 to contact the plurality of wafers under mitigated and smooth condition, and thus the problem of collision and friction can be solved. These U.S. patents include U.S. Pat. Nos. 6,880,718, 7,168,587, 7,182, 203. However, this way of laterally driving, it is easy for an offsetting force to generate on the moving direction of movable bolts 231, causing failure of insertion of movable bolts into socket holes 13 of container body 10. Thus, the container body 10 and the door 20 cannot be closed, and the manufacturing cost of FOUP is also increased.

SUMMARY OF THE INVENTION

In door component of front opening unified pod (FOUP) of prior art, the latch component is composed of complex mechanic apparatus, which not only leads to higher failure rate but also generates too much mechanic friction in the operating process that may lead to pollution of wafer. One objective of the present invention is thus to provide a front opening unified pod (FOUP) disposed with latch component with oval cam so that the moving bars can move to and fro on only one plane surface and the latch component can also be simplified.

Another objective of the present invention is to provide a front opening unified pod (FOUP) disposed with latch component with oval cam, wherein with the design of roller, the moving bars can be driven by the oval cam to move to and fro on only one plane surface, the design of which reduces friction generated in the moving process of moving bars and also reduces pollution.

Still another objective of the present invention is to provide a front opening unified pod (FOUP) disposed with latch component with oval cam, in which a recess is formed between latch components for wafers to be fully and effectively filled in the space of the recess. This makes it possible for the length between the front side and the back side of the FOUP to be shortened, and also for the center of gravity to be more focused on the central part of wafer container to make the wafer container more stable.

Yet another objective of the present invention is to provide a front opening unified pod (FOUP) disposed with latch component with oval cam, wherein wafer restraint component can be disposed on inner surface of the door for effectively fixing the wafers.

According to above objectives, the present invention provides a front opening unified pod (FOUP), which includes a container body and a door. A plurality of slots is disposed in the container body for sustaining a plurality of wafers, and an opening is formed by one sidewall of the container body for importing and exporting the plurality of wafers. The door includes an outer surface and an inner surface; the door joins with the opening of container body via the inner surface for protecting the plurality of wafers in the container body. The characteristic of front opening unified pod (FOUP) is that: a recess is disposed in the inner surface of door and the recess is located between two platforms. Further, a latch component is disposed in a respective platform. The latch component includes an oval cam, a pair of moving bars and one end of a respective moving bar contacting the oval cam, at least a pair of rollers disposed in the platform and a respective roller fixed in slide groove of a respective moving bar, and a locating spring being an integral part of a respective moving bar.

The present invention further provides a front opening unified pod (FOUP) with a container body and a door. A plurality of slots is disposed in the container body for sustaining a plurality of wafers, and an opening is formed by one sidewall of the container body for importing and exporting of the plurality of wafers. The door includes an outer surface and an inner surface; the door joins with the opening of container body via the inner surface for protecting the plurality of wafers that is located in the container body. The characteristic of front opening unified pod (FOUP) is that: at least a latch component is disposed between the outer surface and the inner surface of the door. The latch component includes an oval cam, a pair of moving bars and one end of a respective moving bar contacts the oval cam, at least a pair of rollers disposed between the outer surface and the inner surface of the door and fixed in slide groove of a respective moving bar, and a locating spring being an integral part of a respective moving bar.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 16B is a view of the wafer restraint module of another front opening unified pod (FOUP) of the present invention in the process of restricting the wafer;

DESCRIPTION OF THE PREFERRED EMBODIMENT

In order to disclose the skills applied in, the objectives of, and the effects achieved by the present invention in a more complete and clearer manner, preferred embodiments are herein described below in detail with related drawings disclosed for reference.

Figure 1:
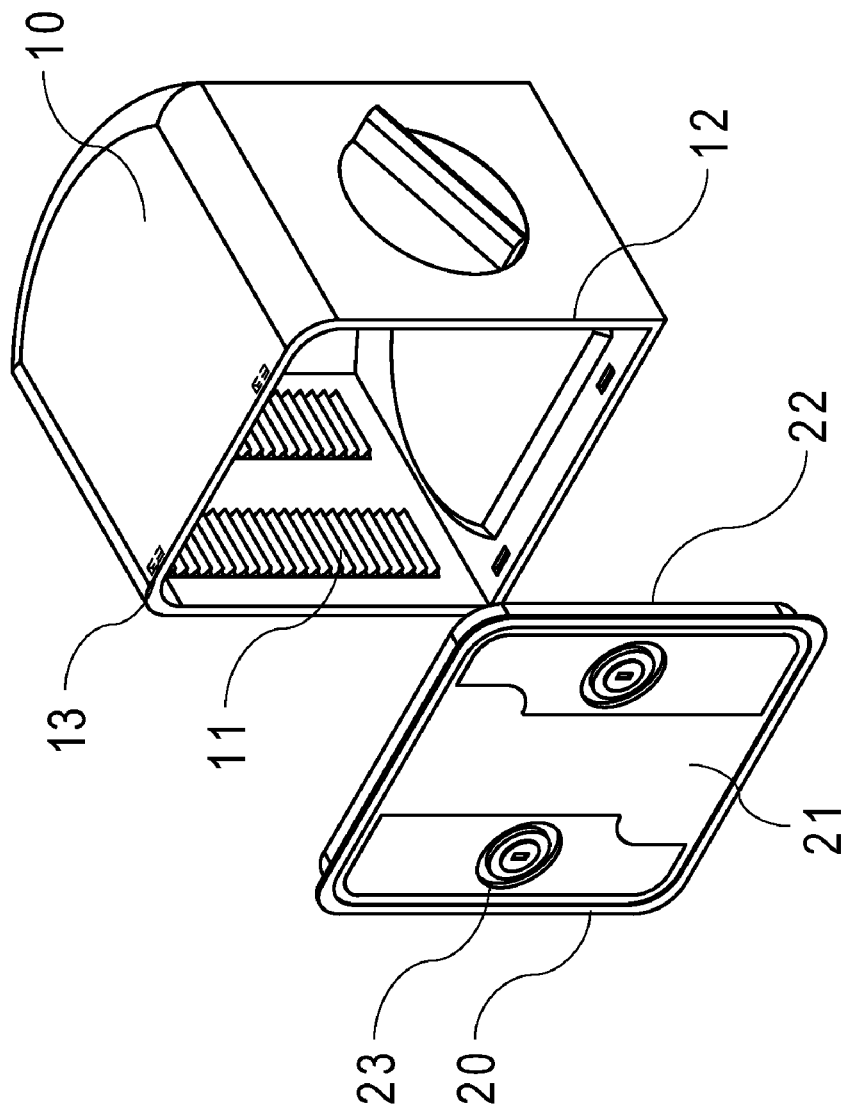
FIG. 1 is a view of the front opening unified pod (FOUP) of the prior art.
Figure 2:
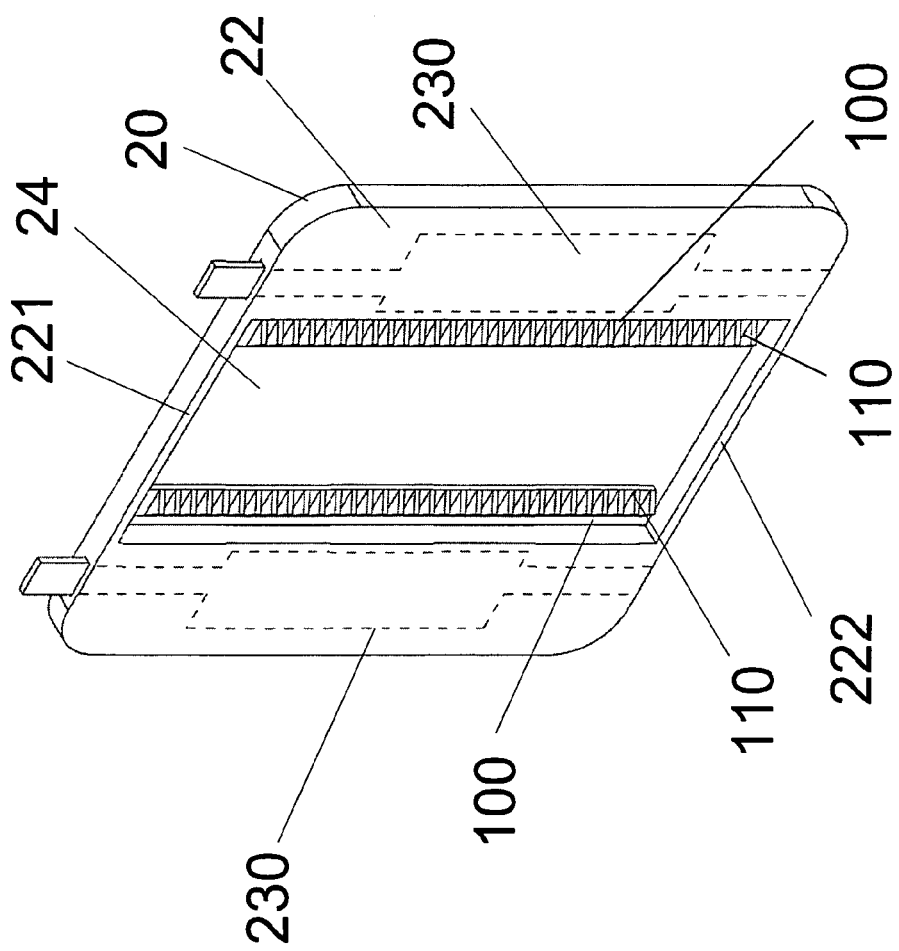
FIG. 2 is a view of the door of the front opening unified pod (FOUP) of the prior art.
Figure 3:
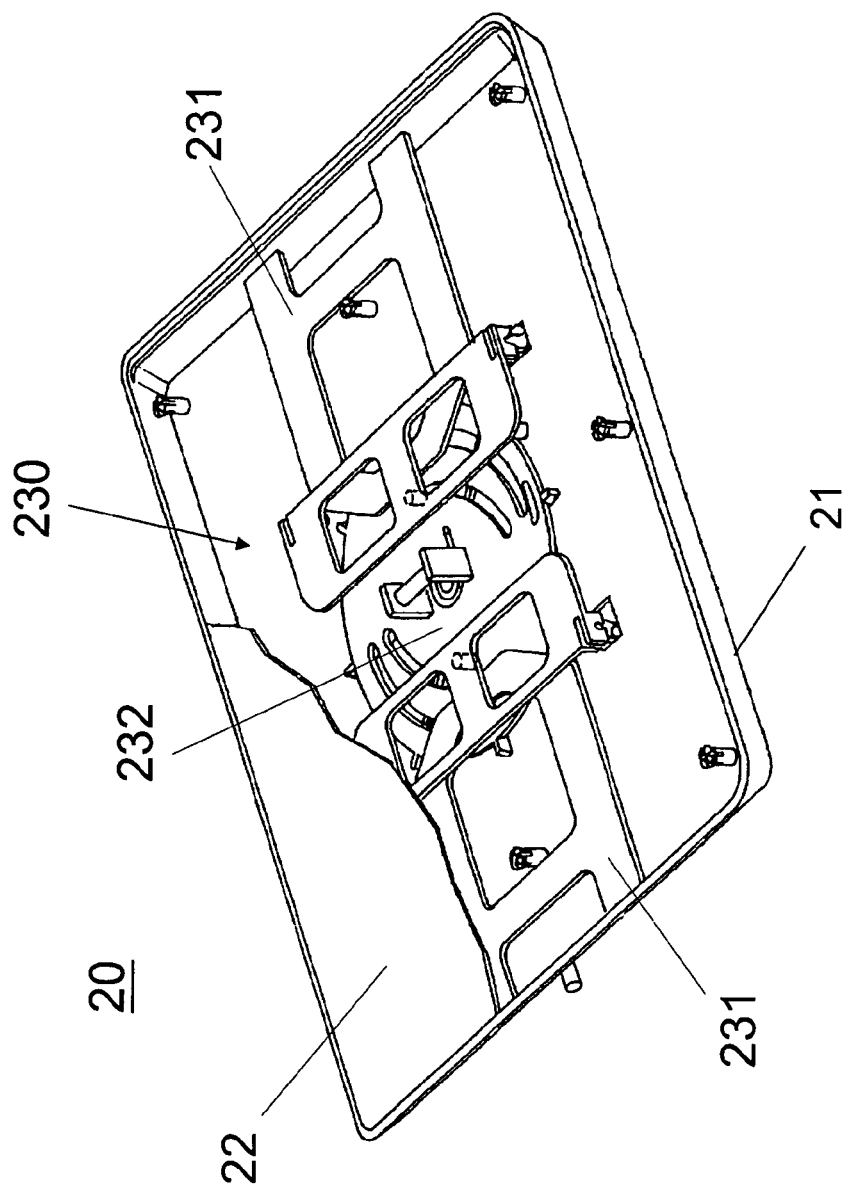
FIG. 3 is a view of another door of front opening unified pod (FOUP) of the prior art.
Figure 4:
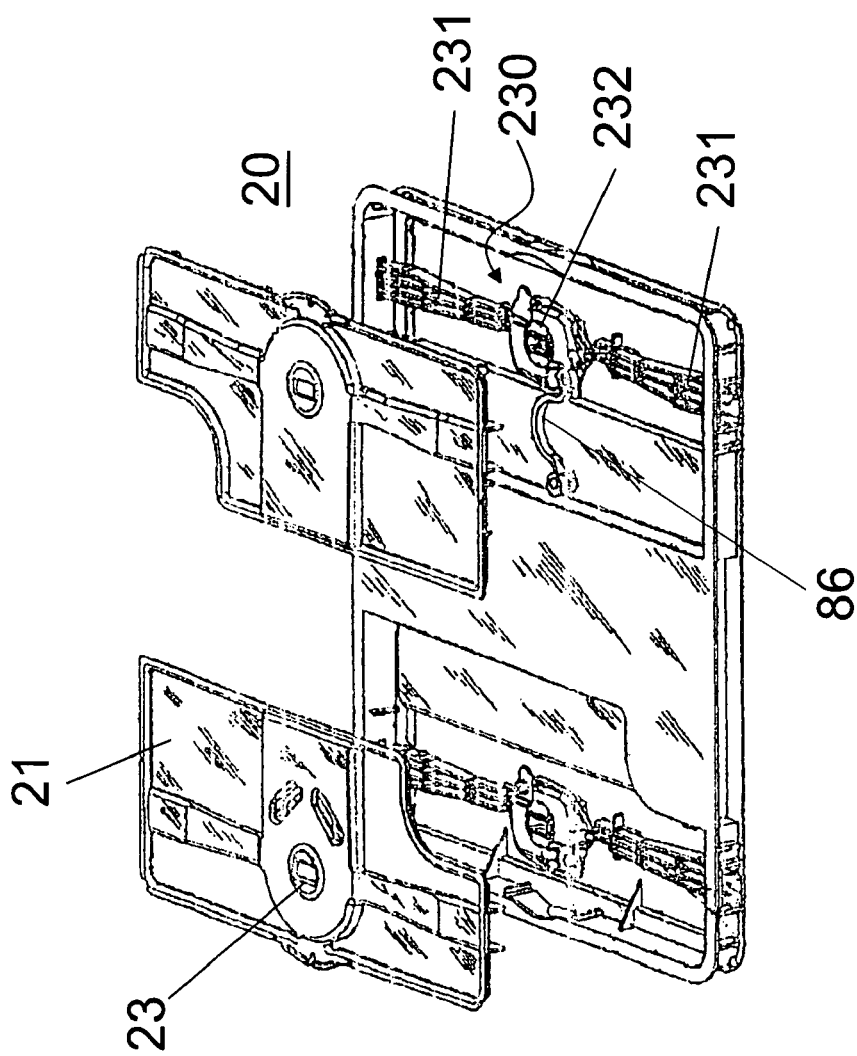
FIG. 4 is a view of still another door of front opening unified pod (FOUP) of the prior art.
Figure 5:
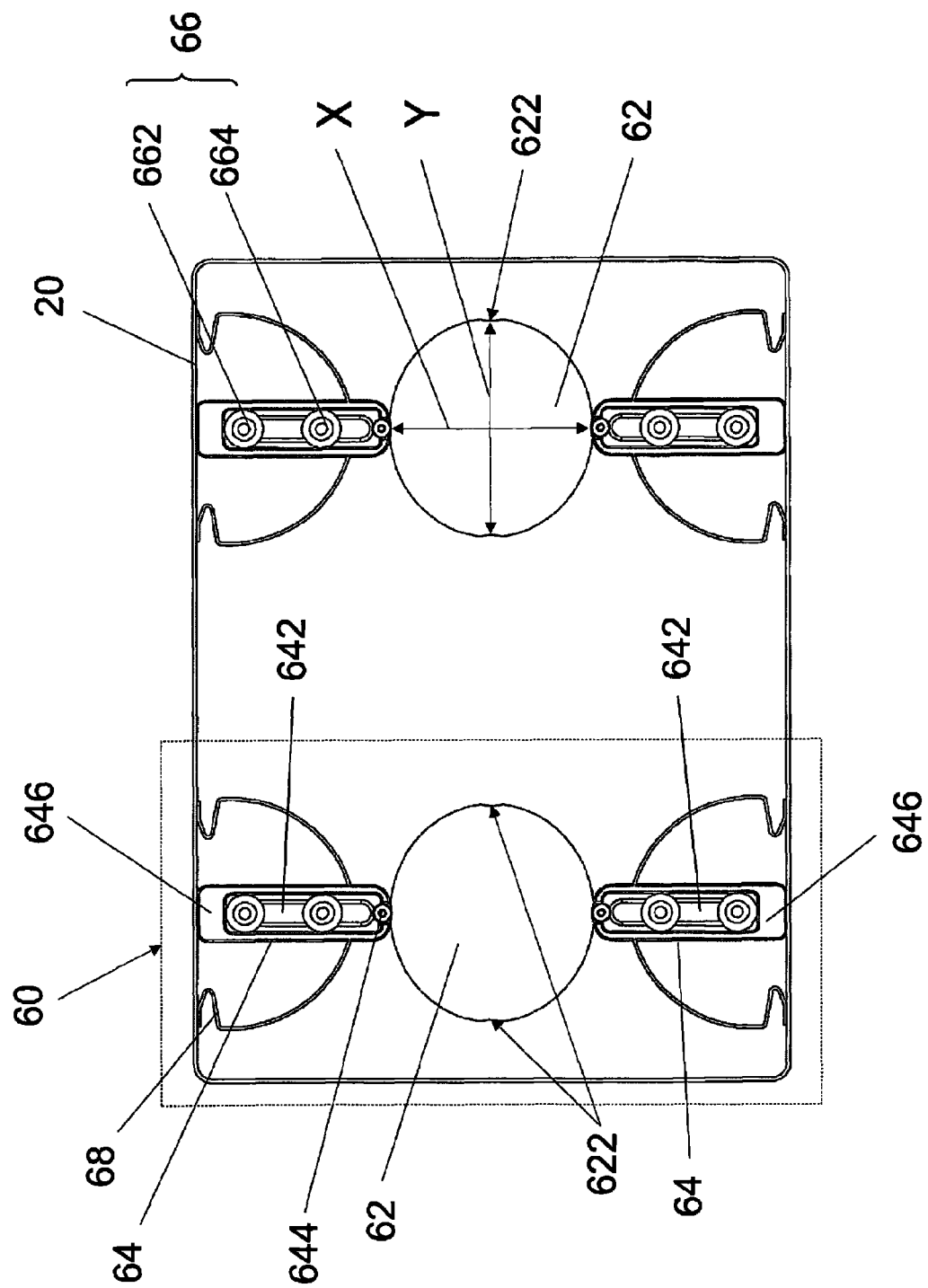
FIG. 5 is a view of the door of a front opening unified pod (FOUP) of the present invention.
Figure 6:
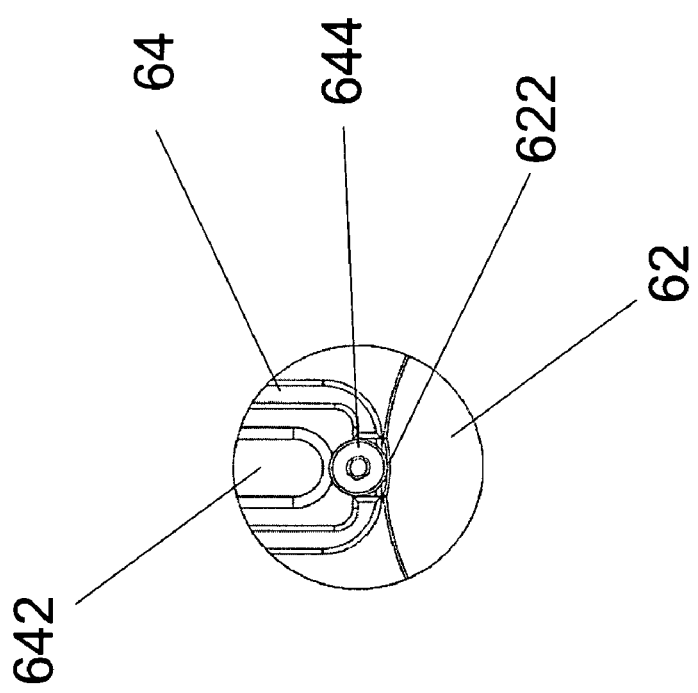
FIG. 6 is part of a magnified view of the latch component in FIG. 5 of the present invention.

Referring to FIG. 5, which is a top view of latch component 60 in door 20 of front opening unified pod (FOUP) of the present invention. As shown in FIG. 5, a pair of latch components 60 are located between outer surface and inner surface of door 20, in which a respective latch component 60 is composed of an oval cam 62, a pair of moving bars 64 and one end of a respective moving bar 64, a respective oval cam 62, at least a pair of rollers 66 which disposed between outer surface and inner surface of door 20 and a respective roller fixed in slide groove 642 of a respective moving bar 64, and a locating spring 68 being an integral part of a respective moving bar 64. Then, referring to FIG. 6 shows a magnified view of two ends of a respective oval cam 62 that contact a respective moving bars 64. As shown in FIG. 6, in a preferred embodiment of the present invention, a locating roller 644 can be further disposed where each moving bar 64 contacts the oval cam 62. When the oval cam 62 turned, the force of friction between the moving bars 64 and the oval cam 62 can be reduced. Moreover, with the design of a plurality of locating grooves 622 on oval cam 62, when the oval cam 62 turns, the locating rollers 644 can slide smoothly into the locating groove 622 as a point of restriction for turning oval cam 62. In this preferred embodiment of the present invention, the oval cam 62 can be made of metal or polymer plastic material, which is not limited in the present invention.

Figure 7A:
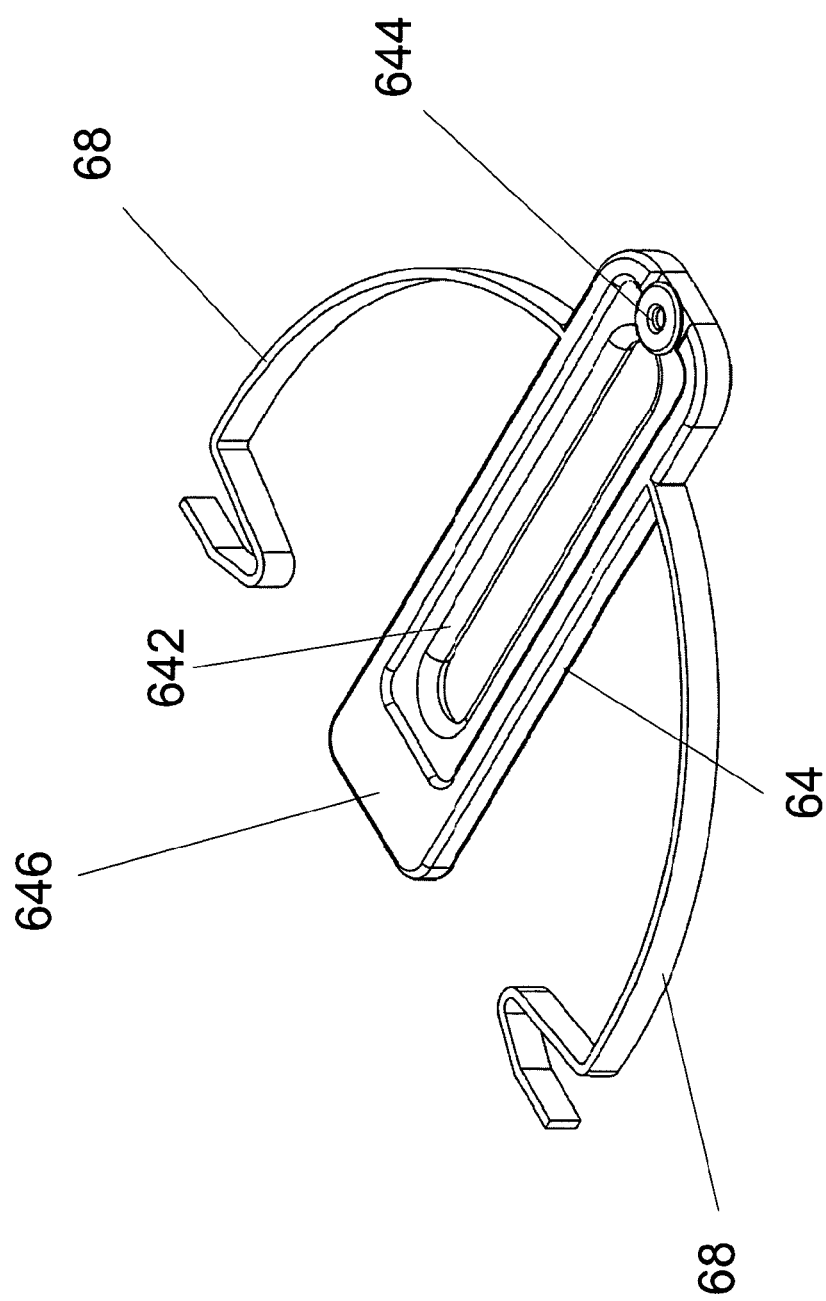
FIG. 7A to FIG. 7C are magnified views of the moving bars of the latch component of the present invention.
Figure 7B:
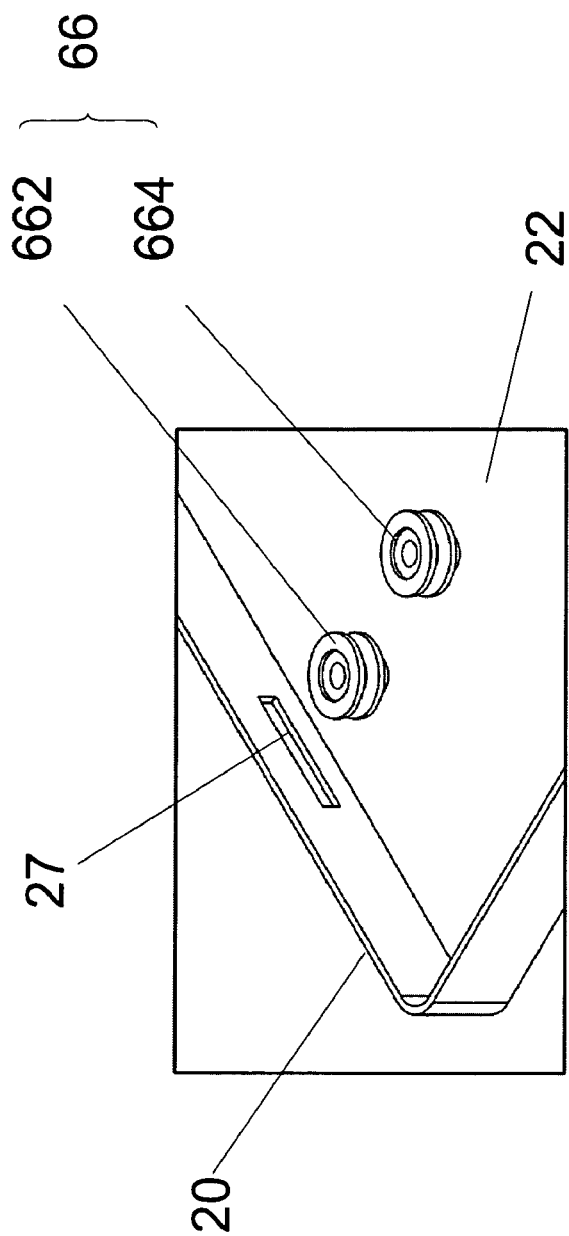
Figure 7C:
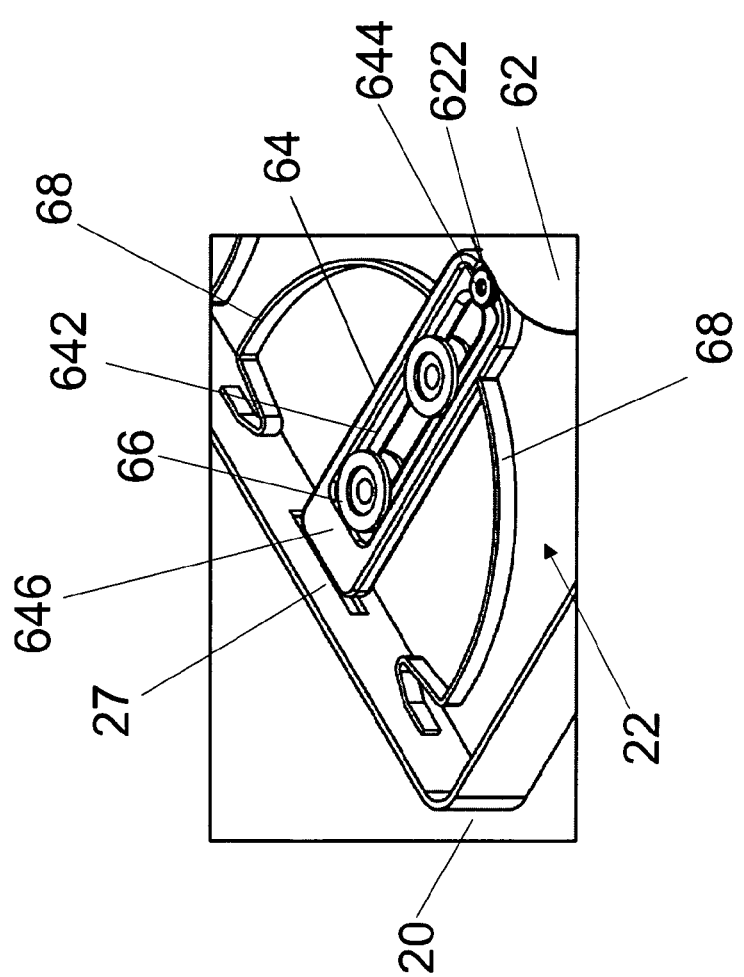

In the following, referring to FIGS. 7A-7C, show the views of the moving bars 64 of the latch component 60 of the present invention. On one end of moving bars 64 is disposed with a locating roller 644, and on the opposite end is a physical plane surface 646. Between the two ends of a slide groove 642 is formed with the rollers 66 that are fastened in the door 20. Moreover, the end of moving bars 64 near the locating rollers 644 is connected with one end of locating spring 68, and the other end of locating spring 68 is fixed on the door 20. Therefore, when the door 20 is to close the opening 12 of container body 10, the door 20 and the container body 10 are first joined and then the oval cam 62 is turned; when the oval cam 62 turns, the moving bars 64 are pushed by the oval cam 62 toward the edge of the door 20. Thus,. the physical plane surface 646 of moving bars 64 is allowed to go through the latch hole 27 of door 20 and extends into the socket hole 13 that located near the edge of opening of the container body 10 and corresponding with latch hole 27, and the container body 10 and the door 20 can be joined together and the closing procedure of container body 10 is thus completed. Meanwhile, the locating spring 68 is compressed, and thus when door 20 is to be opened, with the turning of oval cam 62, and according to Hooke's law, a force of locating spring 64 would be generated to drive the moving bars 64 to resume to the location in an opening status. In preferred embodiment of the present invention, the moving bars 64 and the locating spring 68 can be made of metal or polymer plastic material, which is not limited in the present invention and the material of roller 66 is not limited either in the present invention.

Moreover, as shown in FIG. 7B, in a preferred embodiment, the rollers 66 are disposed in pair in the door 20 and each the pair of rollers 66 is at a proper distance from another. Therefore, when the roller 662 and the roller 664 are fixed in slide groove 642 of the moving bars 64, the pair of rollers 66 can accurately and smoothly guide on the plane surface 646 of moving bars 64 through the latch hole 27 that is located on the door 20.

What is to be emphasized here is that, in the process of the present invention described above, an oval cam 62 and the moving bars 64 are used to describe the operating procedures of latch component 60, but actually each oval cam 62 is in contact with a pair of moving bars 64, and in each door 20 that is disposed with a pair of latch components 60 (as shown in FIG. 5, the door 20 of the present invention is in opening status). Due to the cam in the latch component 60 of the present invention is an oval cam 62, which forms a pair of latch holes (not shown in Figure) on the outer surface 21 of the door 20. Since the oval cam 62 has a longer radius Y and a shorter radius X, the difference between two different radiuses of the oval cam 62 is used as a starting component for controlling the to and fro movement of the moving bars 64.

Figure 8:
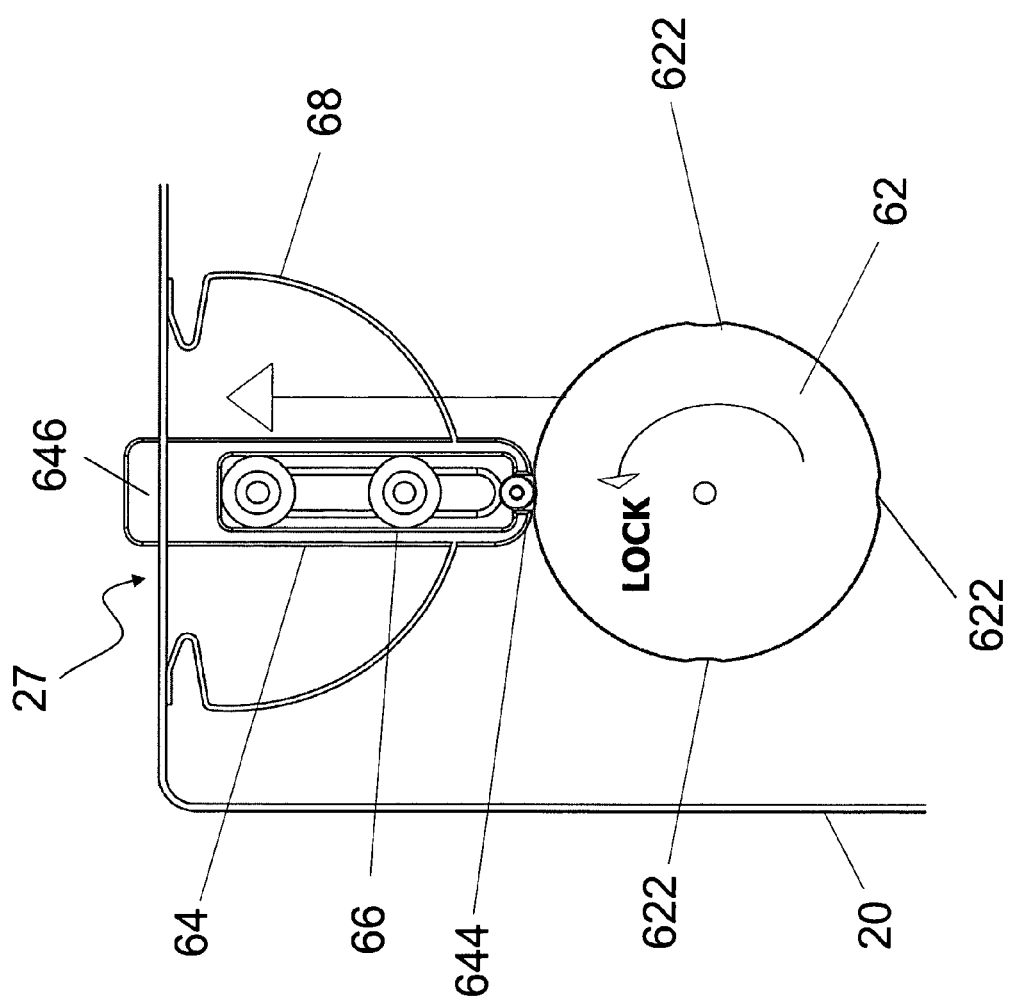
FIG. 8 is a view of the latch component of the present invention in closing status.

For example, the moving bars 64 move up or down along two lateral sides of door 20 for 10 mm~30 mm in order to let front end of the moving bars 64 to go through the door 20, the length difference between the longer radius and the shorter radius of oval cam 62 should be no less than 10 mm~30 mm Due to the two ends of shorter radius of the oval cam 62 are in contact with a pair of moving bars 64 that located on two ends when the door 20 are opening, apparently, when the door 20 closes to the container body 10, the moving bars 64 on two ends can be made to contact the longer radius of the oval cam 62 by turning the oval cam 62. Since the different in length between the longer radius and the shorter radius of the oval cam 62 should be no less than 50 mm, therefore when the oval cam 62 turns to a locating groove 622 that located on longer radius Y, the front plane surface 646 of the moving bars 64 can be made to go through the latch hole 27 on the door 20, as shown in FIG. 8. What is to be emphasized here is that the moving bars 64 are connected to one end of locating spring 68 near the end of the locating roller 644, and the other end of the locating spring 68 is fixed to the door 20, therefore when the oval cam 62 turns to the locating groove 622 that located on longer radius Y, the moving bars 64 would be pushed by the oval cam 62 toward the latch hole 27 on the edge of the door 20. At this time, the locating spring 68 will be compressed, and thus when the door 20 is to be opened, the oval cam 62 turns to the locating groove 622 that located on shorter radius X, and according to Hooke's law, a force would be generated to let the locating spring 68 would also drive the moving bars 64 to resume to the location in opening status (i.e. the oval cam 62 disposes at the locating groove 622 which located on shorter radius X).

Figure 9:
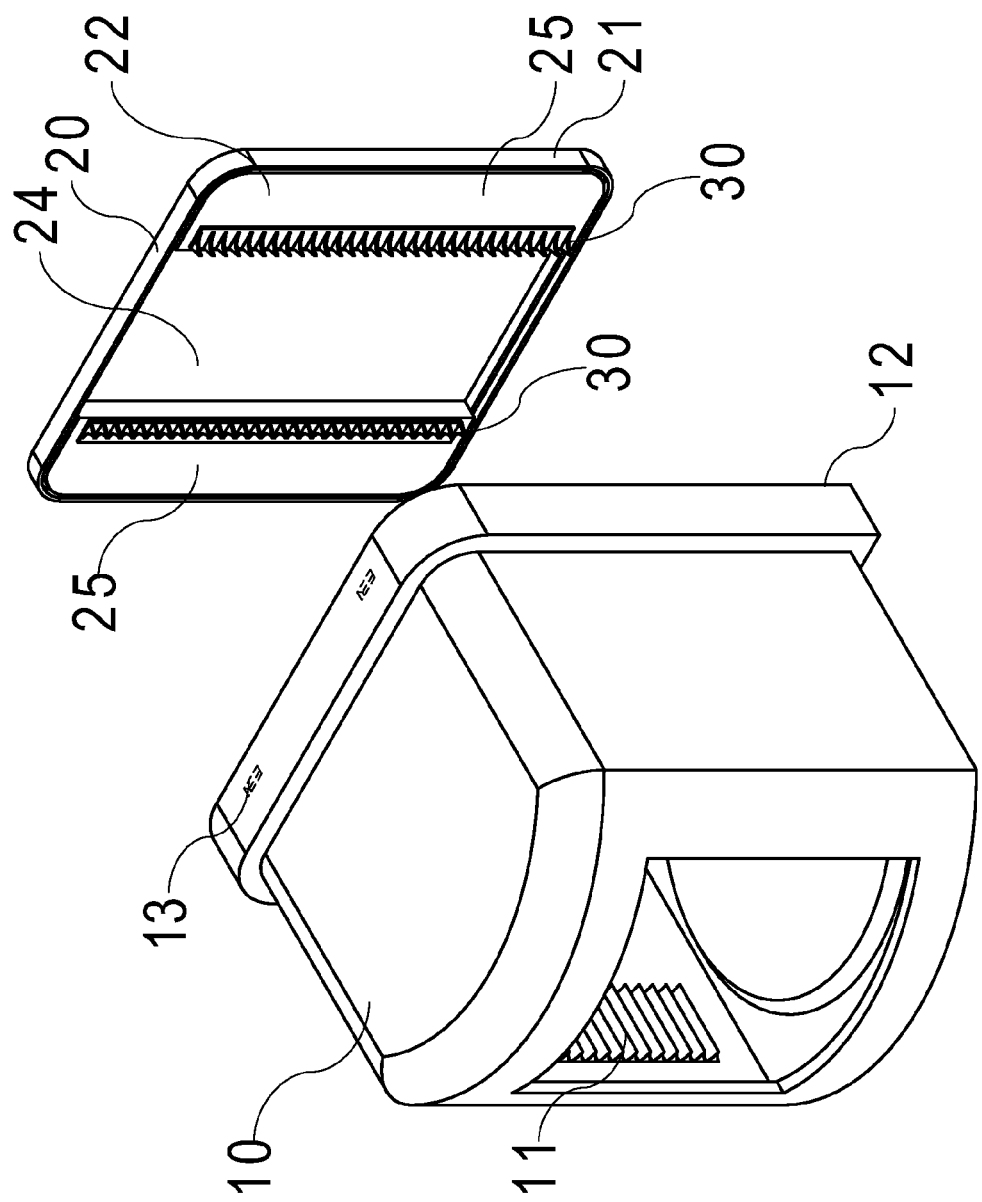
FIG. 9 is a view of a front opening unified pod (FOUP) of the present invention.

Then, referring to FIG. 9, shows a cross-sectional view of a wafer container of the present invention. This wafer container is a front opening unified pod (FOUP) which includes a container body 10 and a door 20. A plurality of slots 11 is disposed in the container body 10 for sustaining a plurality of wafers, and an opening 12 is formed by one sidewall of the container body 10 for importing and exporting the plurality of wafers. The door 20 includes an outer surface 21 and an inner surface 22. The outer surface 21 of the door 20 is disposed with at least one latch hole (not shown in Figure) for opening or closing the front opening unified pod (FOUP). And around the center of inner surface 22 of door 20 is disposed with a recess 24. The recess 24 is between two platforms 25 and inside two platforms 25 is disposed with aforementioned latch component 60. An objective of the recess 24 is to sustain the plurality of wafers in container body 10 for shortening the size of the FOUP. And a wafer restraint module 30 is disposed on each the platform 25 respectively for restricting the movement of wafers toward the opening of the wafer container and controlling the number of wafers settling down the recess 24.

The length of the recess 24 of the inner surface 22 of the door 20 as described above is related to the distance between each plurality of slots 11 in the container body 10 and the plurality of the wafers. The distance between 12" wafers has been a standard regulation in the industry to achieve maximum capacity of loading and ensure at the same time that there is enough space for the mechanical arm to stretch in for importing or exporting. In general, the number of wafers to be in the wafer container is 25 pieces. However, the width and the depth of recess 24 of the present invention can be adjusted. When the thickness of the door 20 is constant, the depth of recess 24 can be adjusted to be deeper, and the width of recess 24 is also adjusted to be wider for the whole wafer to be placed further into the recess 24.

Figure 10:
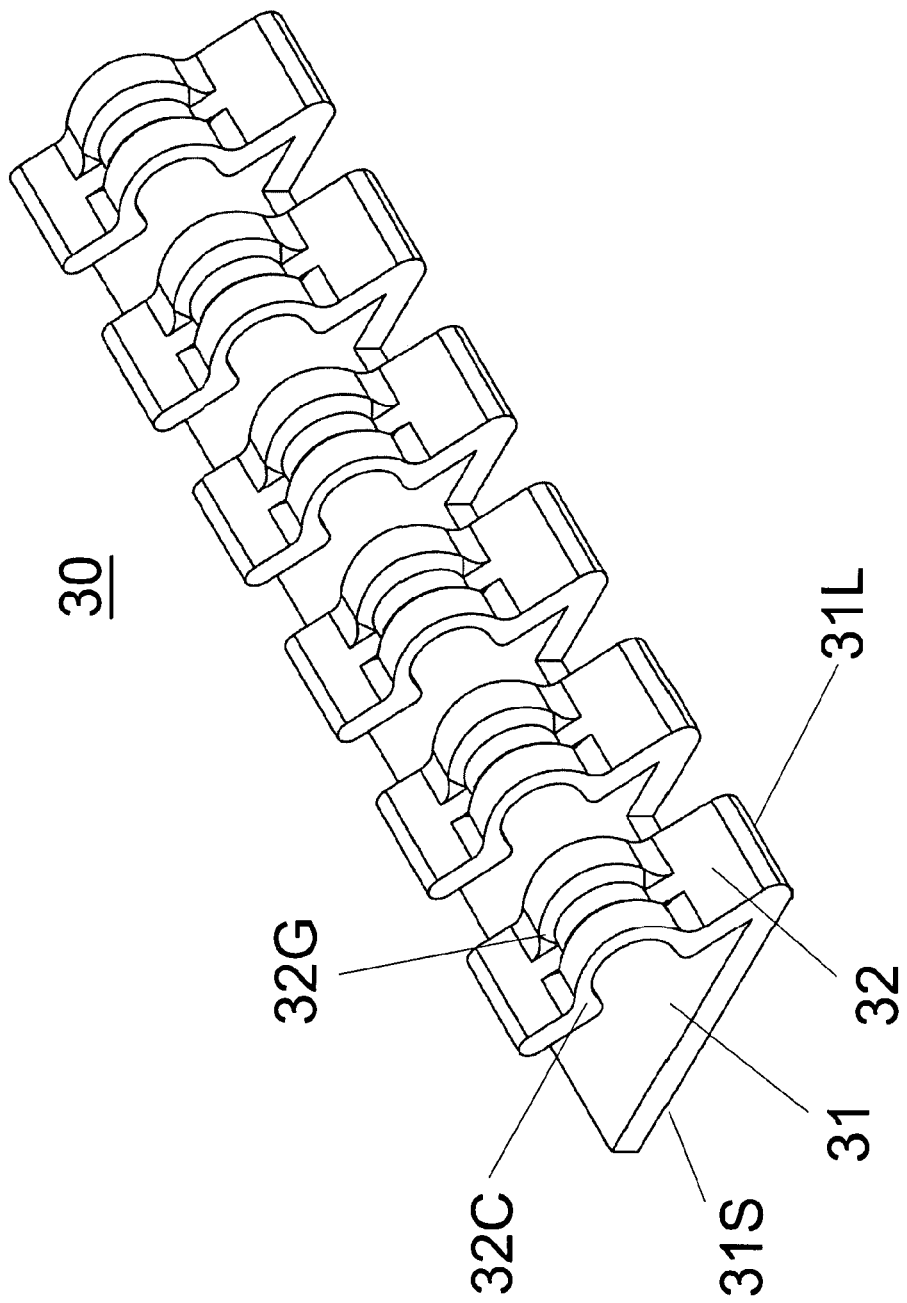
FIG. 10 is a view of the wafer restraint module of a front opening unified pod (FOUP) of the present invention.
Figure 11:
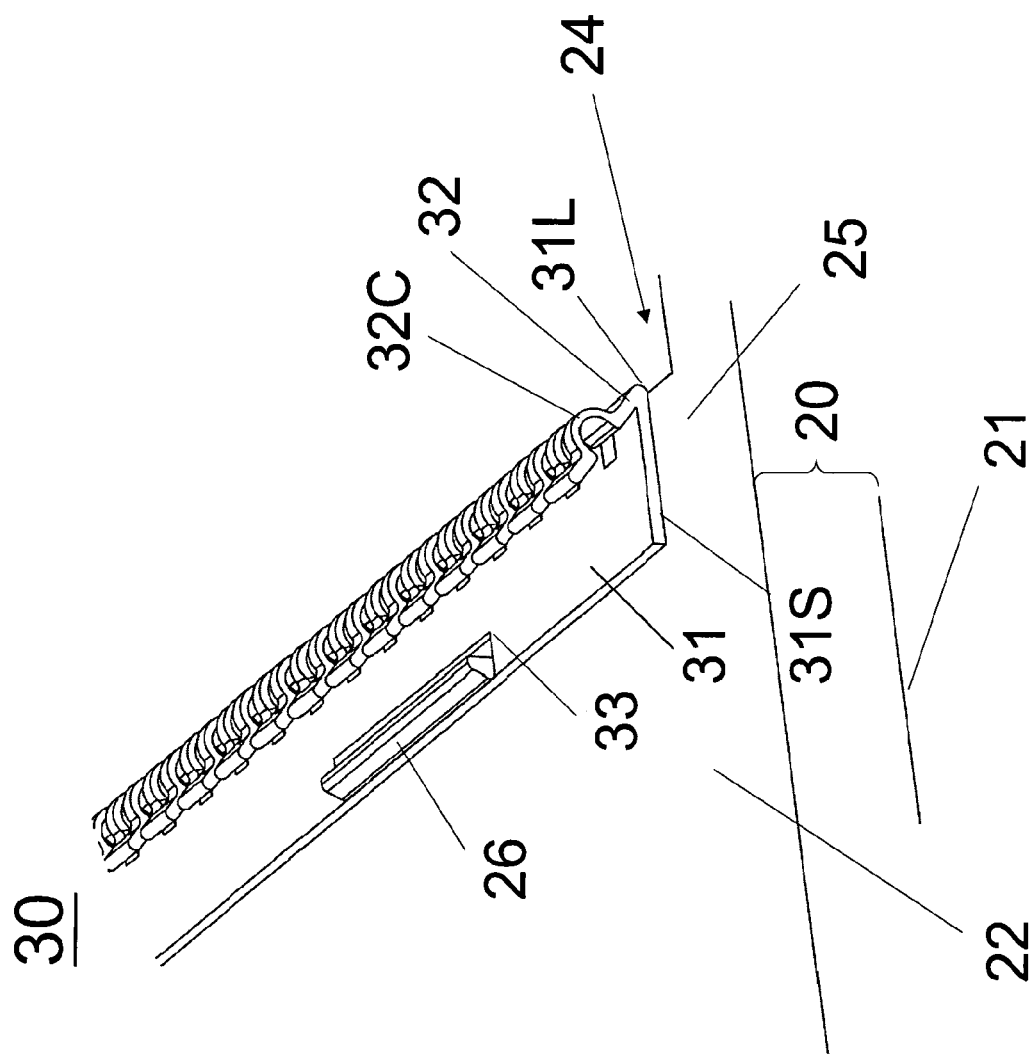
FIG. 11 is a view of the wafer restraint module of a front opening unified pod (FOUP) of the present invention being fixed on the door.

Moreover, referring to FIG. 10 and FIG. 11, shows the views of wafer restraint module of wafer container of the present invention that is fixed to the door. The wafer restraint module 30 includes a rectangular bar base portion 31, which includes two longer sides 31L and two shorter sides 31S. One of the two longer sides 31L is adjacent to the recess 24 to form a plurality of curve portions 32 with a space at interval. A semicircle-shape protruding portion 32C is formed between each curve portion 32 and its free-end. And a guide notch 32G is disposed on semicircle-shape protruding portion 32C to contact the plurality of wafers for restricting movement of corresponding the plurality of wafers toward the opening of the wafer container.

Figure 12:
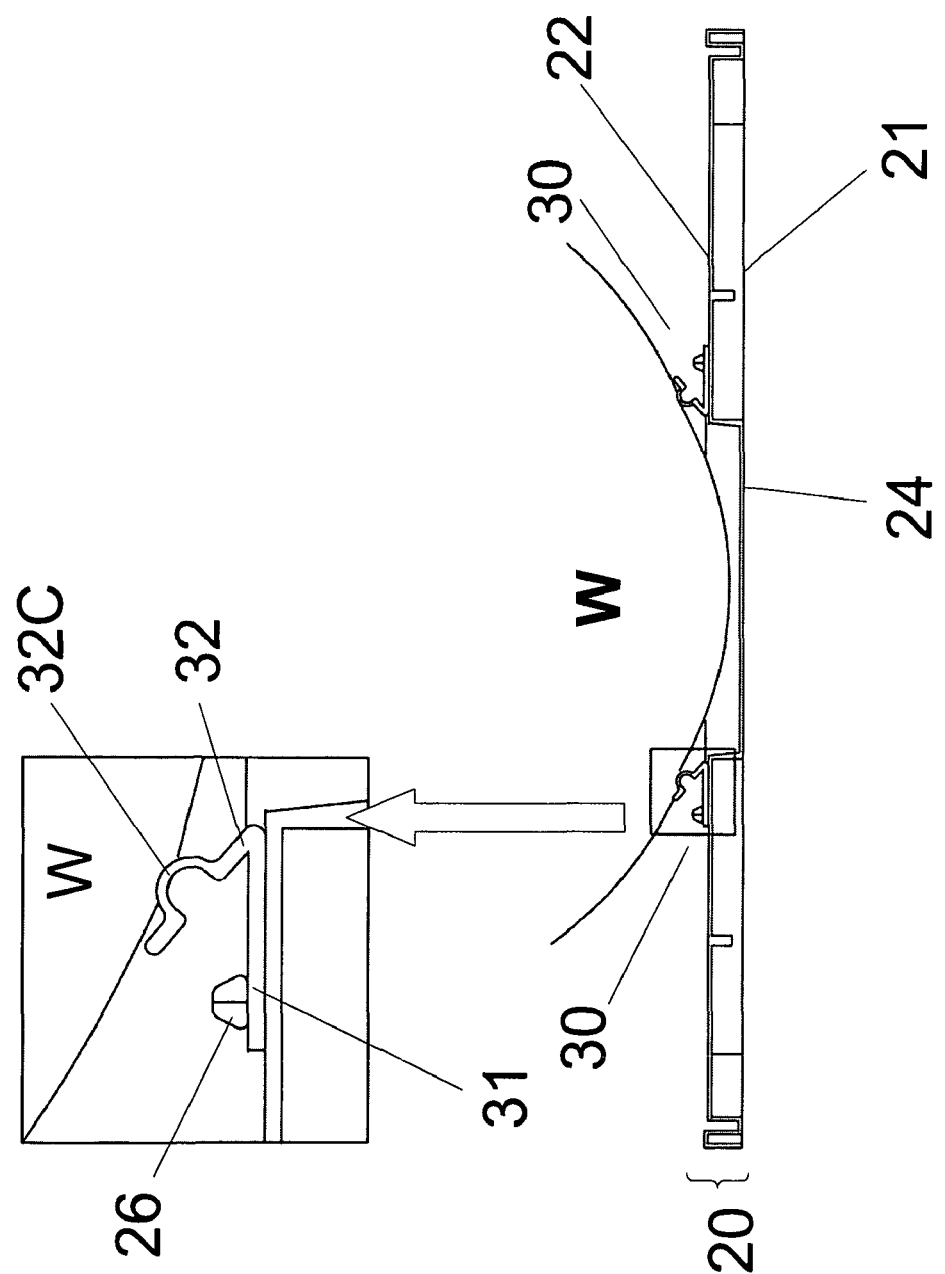
FIG. 12 is a view of the wafer restraint module of a front opening unified pod (FOUP) of the present invention in the process of restricting the wafer.

The guide notch 32G of the semicircle-shape protruding portion 32C is used to sustain the plurality of wafers. The width of the guide notch 32G can be equaled to the thickness of wafer so that the wafer can sink into the guide notch 32G without moving up and down. The surface of guide notch 32G that contacts that plurality of wafers can be coated with a wear-resisting material, such as PEEK material, to reduce the friction for the plurality of wafers. Furthermore, the wafer restraint module 30 can be an integrated structure and can be made of one or two different materials. For example, the base portion 31 and the curve portion 32 are made of one material and the semicircle-shape protruding portion 32C is made of another material and formed on the curve portion 32. Obviously, an included angle, which is about 10 to 60 degrees, is formed between the rectangular bar base portion 31 and the curve portion 32. Since the wafer restraint module 30 on two sides of recess 24 are symmetrical, the resultant forces is formed toward the center of the wafer when the wafer is restricted by wafer restraint module 30 (as shown in FIG. 12) for preventing the wafer from shaking. And the wafer restraint module 30 not only restricts the movement of wafer toward the opening of the wafer container, but also makes the wafer fully sink into the recess 24, so that the length between front side and of back side can be shortened, the center of gravity of the whole wafer container is more focused on the center of wafer container, and the stability of wafer container is also improved. As shown in FIG. 10, as a gap is located in the middle of the plurality of semicircle-shape protruding portions 32C on the curve portion 32, thus the curve portion 32 is more elastic to permit deformation due to crackdown of the wafer.

Figure 13A:
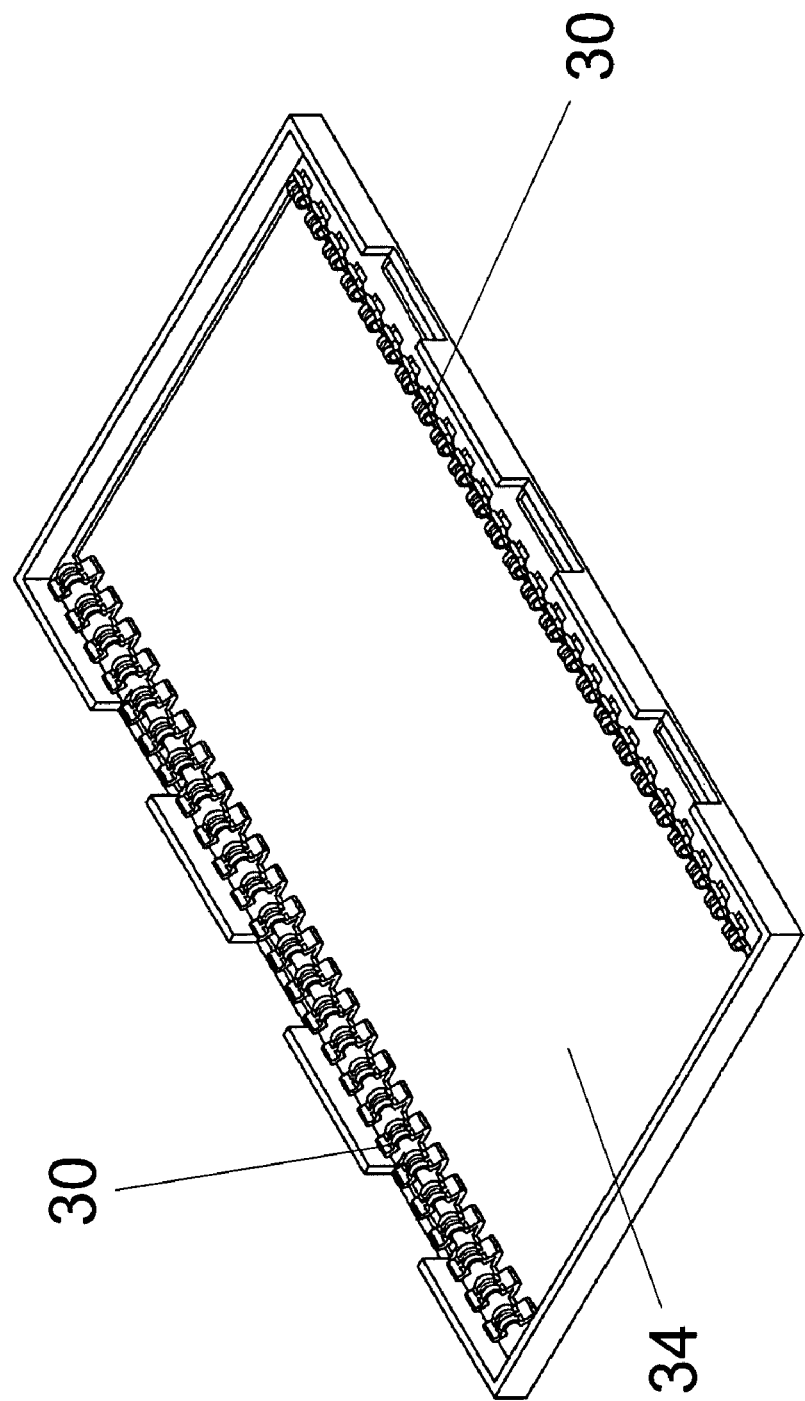
FIG. 13A is a view of the left and right wafer restraint modules of a front opening unified pod (FOUP) of the present invention being an integrated structure.
Figure 13B:
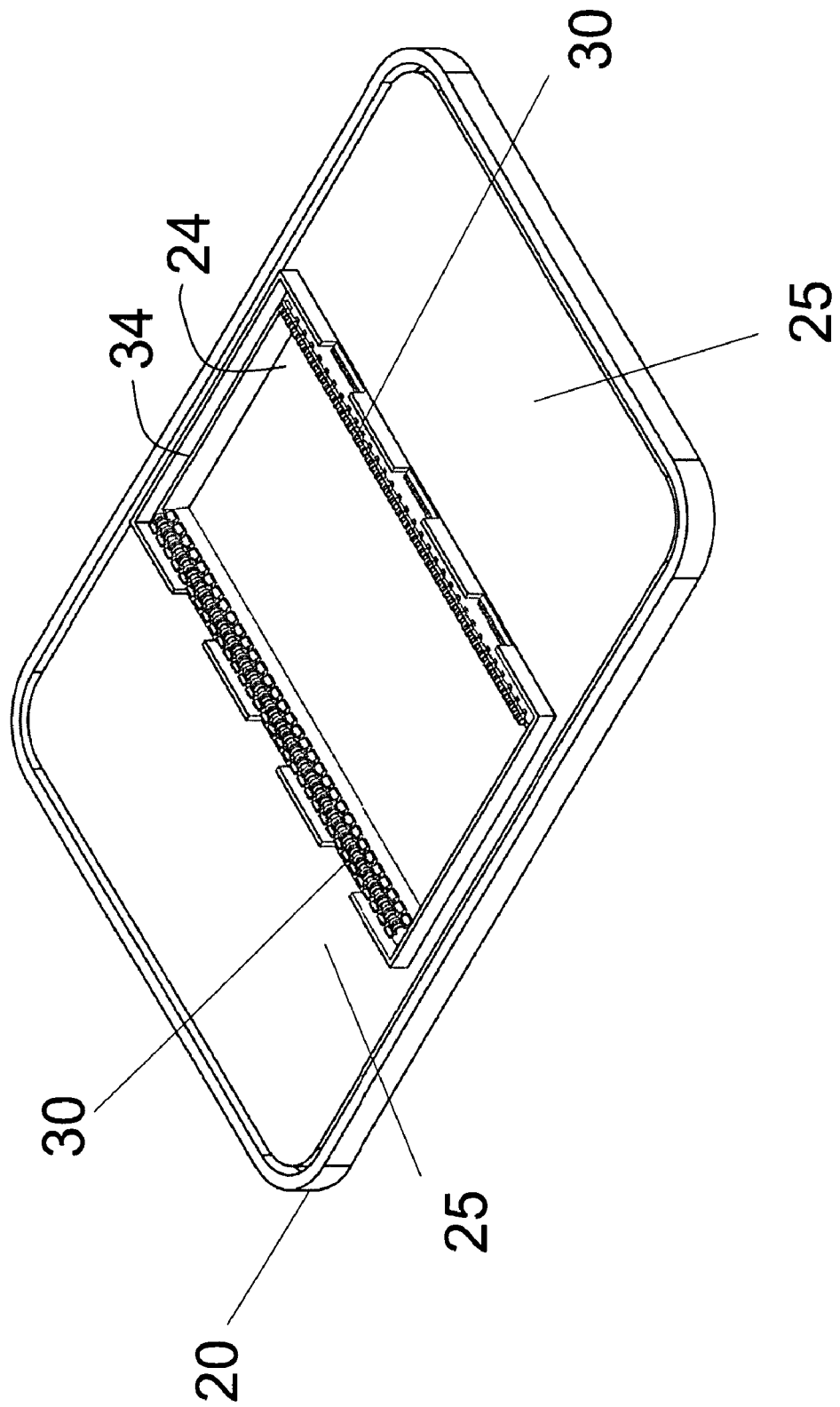
FIG. 13B is a view of the left and right wafer restraint modules of a front opening unified pod (FOUP) of the present invention being an integrated structure fixed on the door.

Furthermore, according to FIG. 5 and FIG. 6, the base portion 31 includes a plurality of snap holes 33, and a snap pillar 26 is disposed on the inner surface 22 that corresponds to the snap holes 33; thus, the wafer restraint module 30 is firmly set on the platforms 25 of the recess 24 of the inner surface 22 of the door 20 by snapping on the platforms 25. In order to facilitate the manufacturing procedures, the wafer restraint module 30 can also be integrated with the inner surface 22 of door 20 to prevent from slackening of the wafer restraint module 30. Then, referring to FIG. 13A and FIG. 13B, the wafer restraint module 30 on two sides of recess 24 can also be an integrated structure, which includes a central hole 34 that corresponds to the recess 24 of door 20. This integrated structure can also be firmly set on the inner surface 22 of door 20 by snapping on or directly integrated with the inner surface 22 of the door 20.

Figure 14:
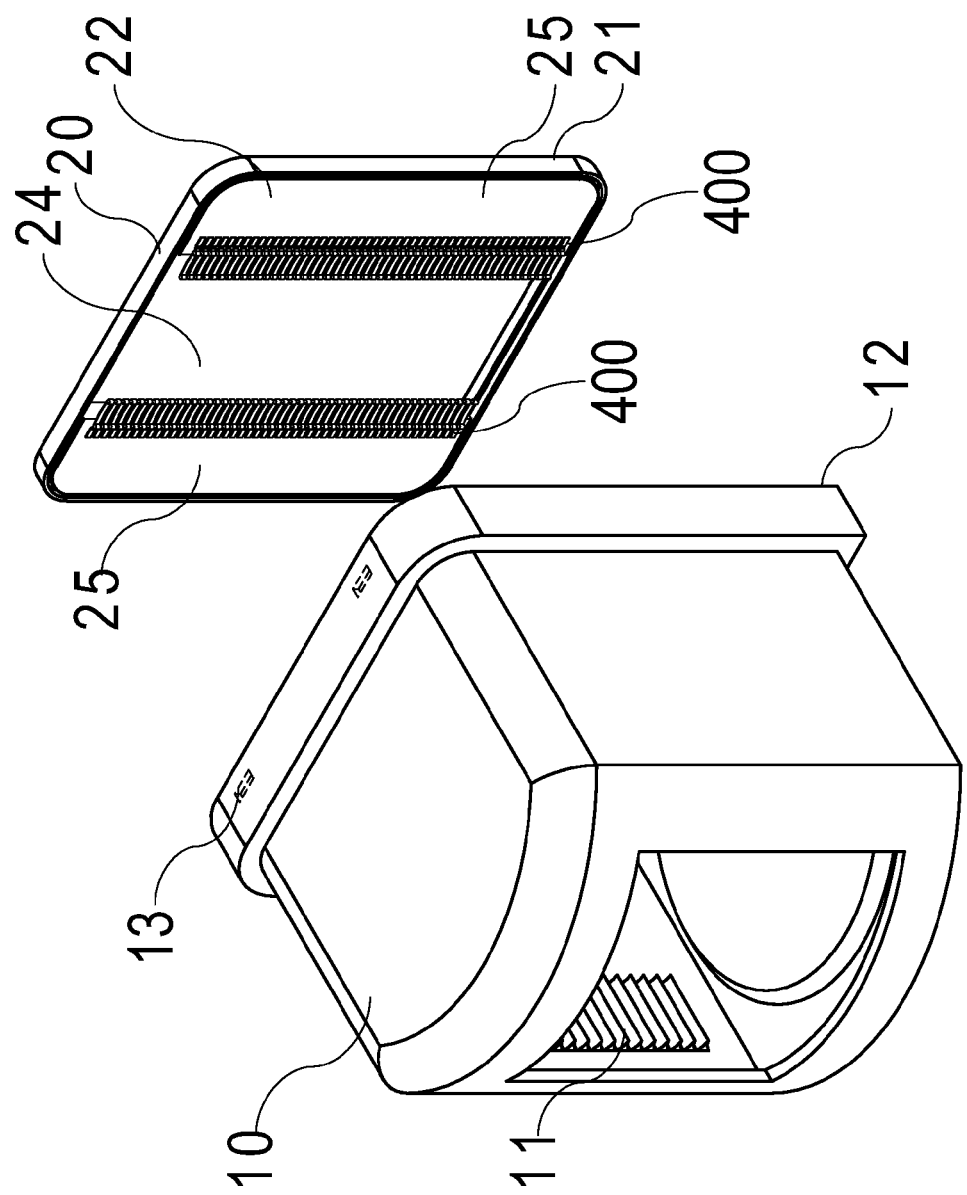
FIG. 14 is a view of another front opening unified pod (FOUP) of the present invention.
Figure 15:
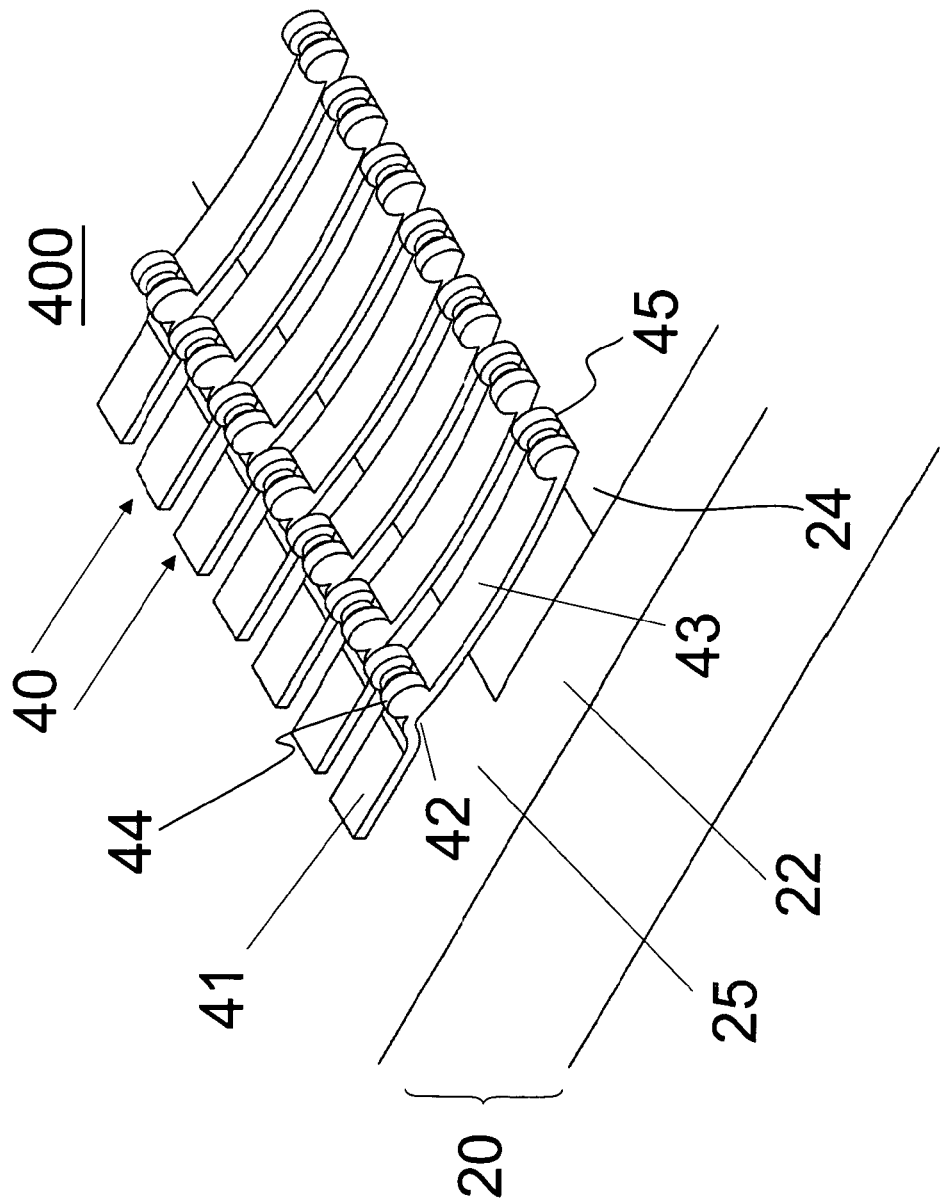
FIG. 15 is a view of the wafer restraint module of another front opening unified pod (FOUP) of the present invention.
Figure 16A:
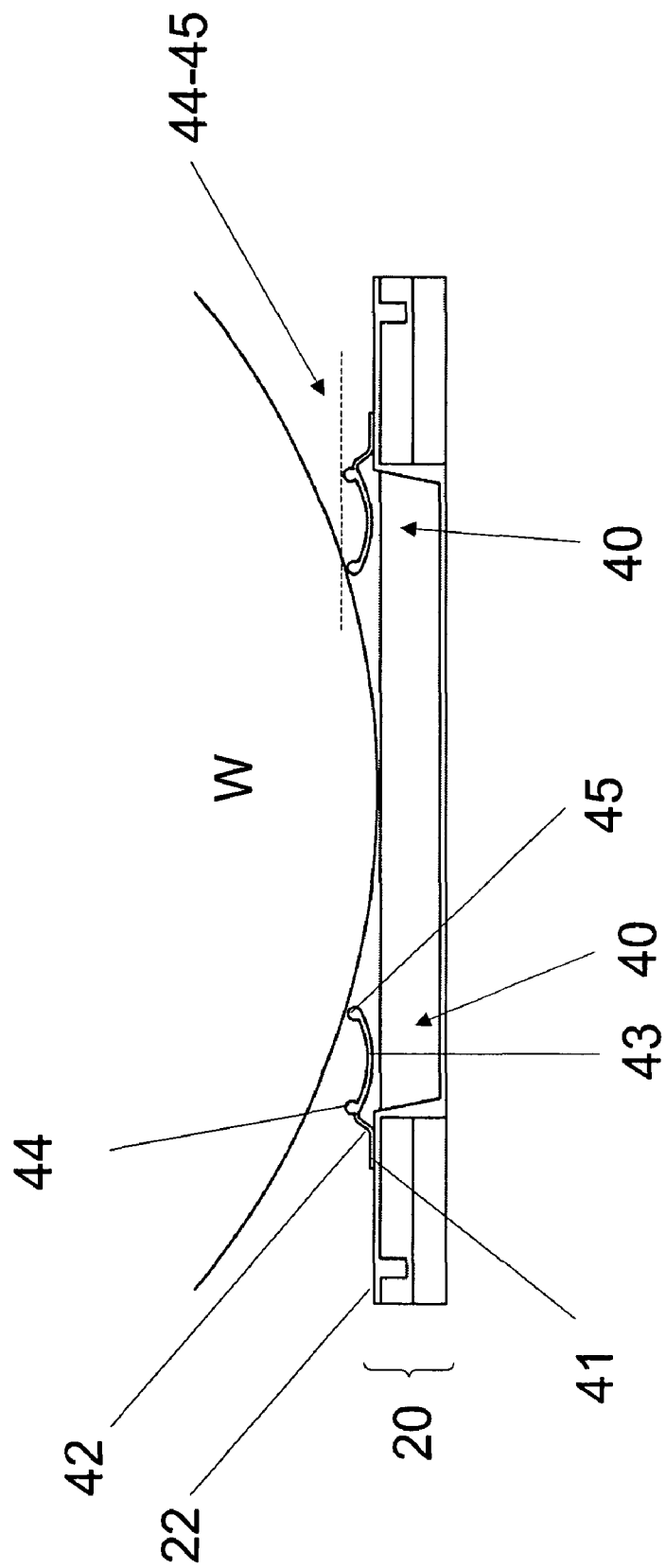
FIG. 16A is a view of the wafer restraint module of another front opening unified pod (FOUP) of the present invention starting to contact the wafer.

Secondly, referring to FIG. 14, is a view of another wafer container of the present invention. The wafer container is the same as the wafer container as shown in FIG. 9 and includes a container body 10 and a door 20. The difference lies in that the wafer restraint module 400 fixed on two sides of the recess 24 of the inner surface 22 of the door 20 is different from the wafer restraint module 30. As shown in FIG. 15A and FIG. 16A, the wafer restraint module 400 on two sides of the recess 24 is formed by a plurality of wafer restraint components 40 with a space at interval, and each wafer restraint component 40 is aligned with a corresponding wafer restraint module 40 of the wafer restraint module 400 that is located on the other side of the recess 24. Each wafer restraint component 40 includes a base portion 41 that is fixed on the inner surface 22 of the door 20, and one sidewall of the base portion 41 is located adjacent to the recess 24. The sidewall of base portion 41 described above is extended toward the opening of the container body 10 to form a curve portion 42 and turned to the central portion of the recess 24 to form a plurality of bent arms 43. The plurality of bent arms 43 are disposed on two side of the top of the recess 24, and the cross of the bent arm 43 and the curve portion 42 includes a first contact head 44, and the free-end of the bent arm 43 includes a second contact head 45 thereon. As shown in FIG. 16A, each wafer restraint component 40 is an elastic integrated structure (for example: thermal-elastic plastic). When the door 20 and the container body 10 are about to be joined, the connected line (44-45) between the first contact head 44 and the second contact head 45 of the wafer restraint component 40 is parallel to the inner surface 22 of the door 20. Meanwhile, the wafer first contacts the second contact head 45 to deform the curve portion 42 to lever the bent arm 43, so as another contact head of the bent arm 43, i.e. the first contact head 44, will contact the wafer in sequence. Meanwhile, as shown in FIG. 16B, the door 20 is sealed with the container body 10, and an included angle is formed between the connected line (44-45) of the first contact head 44 and the second contact head 45 of the wafer restraint component 40 and the inner surface 22 of the door 20. Obviously, each wafer restraint component 40 contacts the wafer with two contact heads for the wafer to be sustained and also be restricted from moving toward the opening of the wafer container. The tiny dust particles that are generated due to vibration during transportation of wafers can thus be reduced. In addition, the wafer can also effectively sink into the recess 24 for the size of the wafer container to be shortened.

The curve portion 42 of the wafer restraint component 40 is an elastic structure (for example: thermal-elastic plastic) with a bent angle. Thus, in the sealing procedure, when the door 20 and the container body 10 go from the status of not closed to the status of closed, the bent angle would be changed to make the first contact head 44 that contacted the second contact head 45. Furthermore, the bent portion 42 and the bent arm 43 can be made of two different materials, such as plastic with different hardness which can generate larger deformation for the curve portion 42 and the bent arm 43 would not easily deform. The first contact head 44 and the second contact head 45 include a recess respectively, so as the wafer can sink into the recess to avoid up and down movement of the wafer. Moreover, the plurality of wafer restraint components 40 can form a base portion, wherein the base portion is firmly disposed on the inner surface 22 of the door 20. Certainly, the plurality of wafer restraint components 40 can also be integrated with the inner surface 22 of the door 20 to reduce the manufacturing cost.

Figure 17:
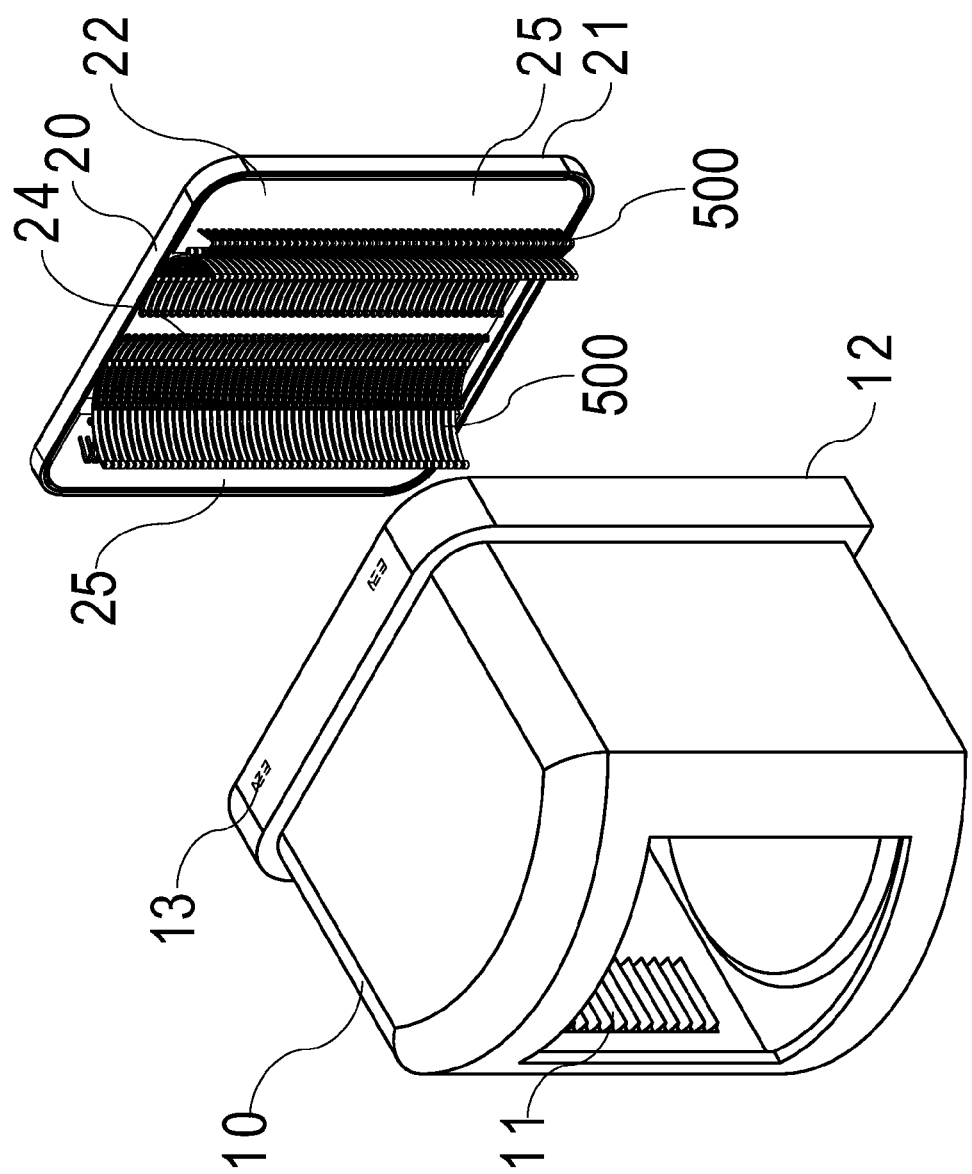
FIG. 17 is a view of still another front opening unified pod (FOUP) of the present invention.
Figure 18:
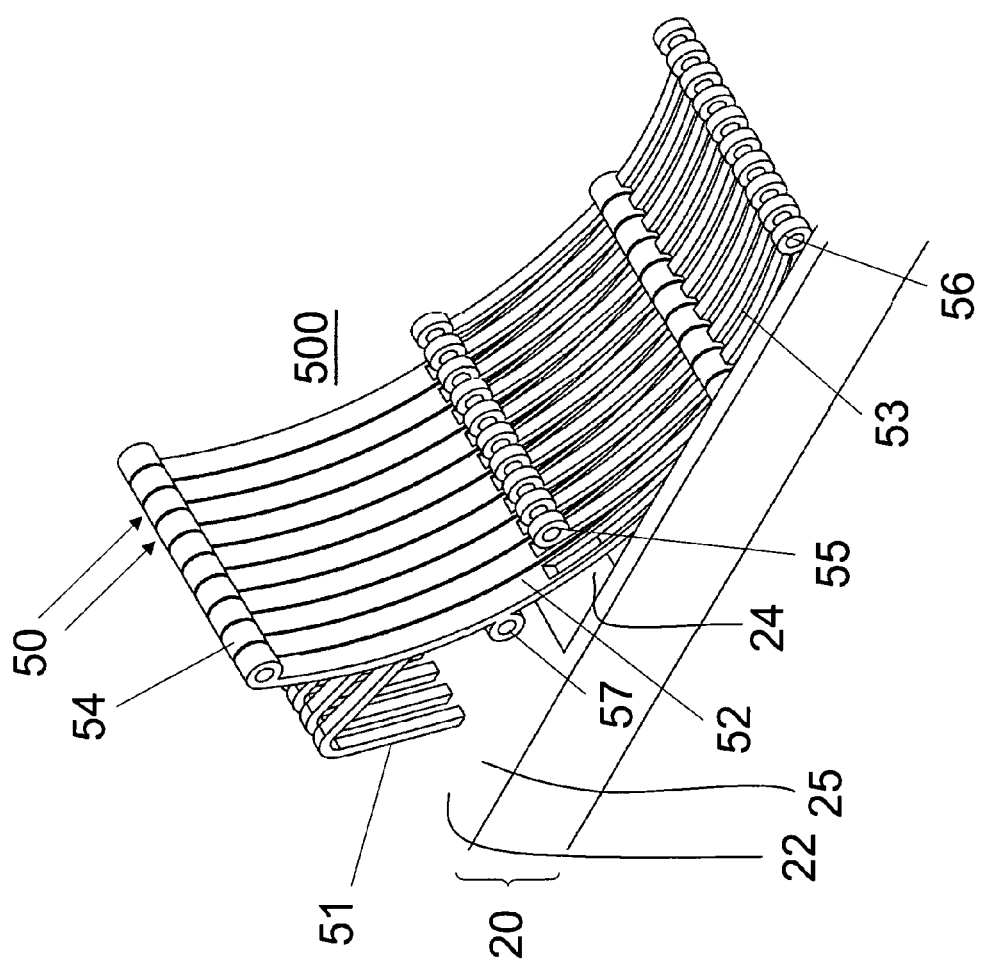
FIG. 18 is a view of the wafer restraint module of still another front opening unified pod (FOUP) of the present invention.
Figure 19A:
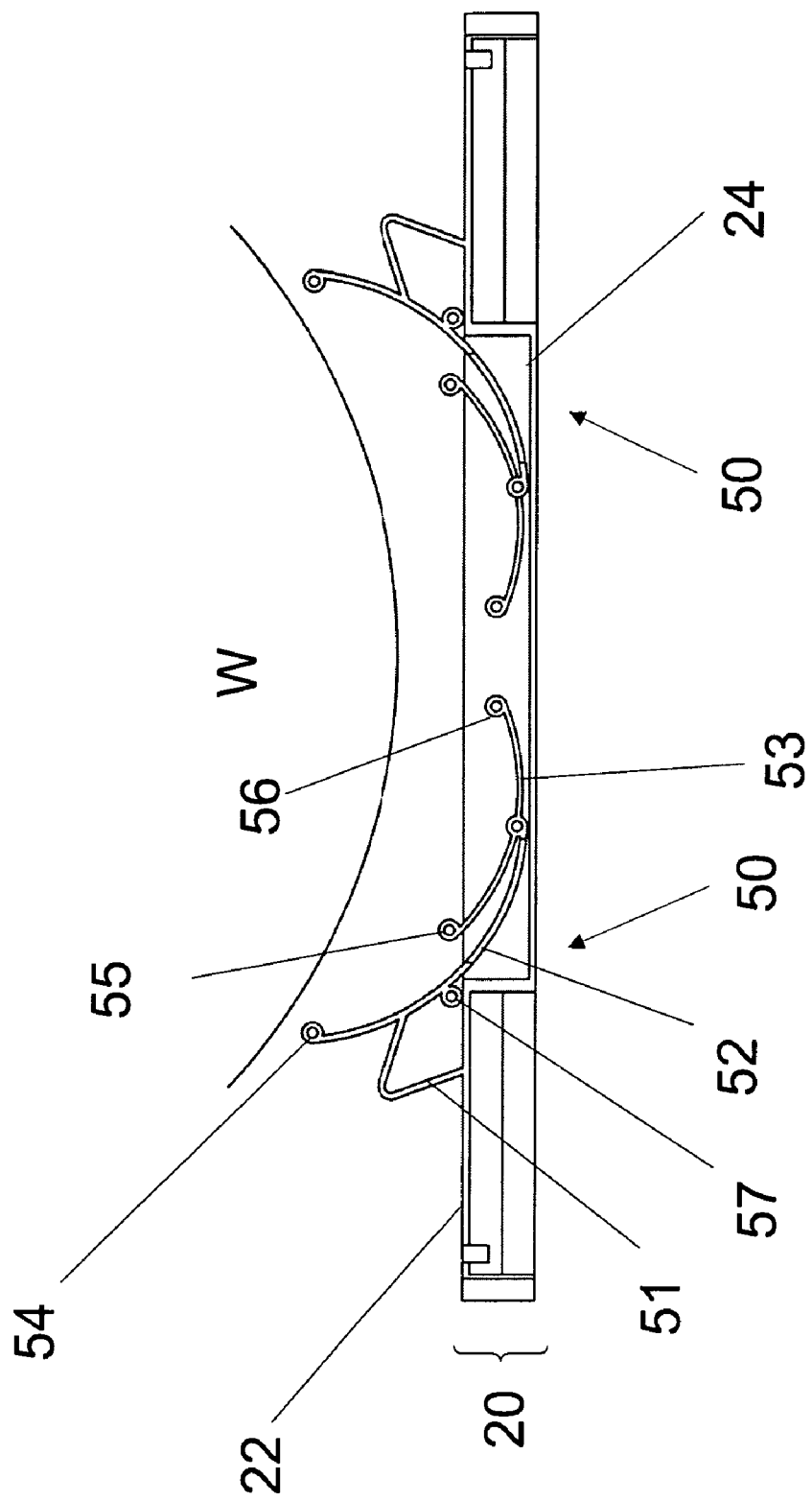
FIG. 19A is a view of the wafer restraint module of still another front opening unified pod (FOUP) of the present invention not contacting the wafer.

Then, referring to FIG. 17, which is a view of still another wafer container of the present invention. This front opening unified pod (FOUP) is similar to the wafer container as shown in FIG. 14 in that it includes a container body 10 and a door 20, yet different in that each of the wafer restraint modules 500 located on two sides of the recess 24 of the inner surface 22 of the door 20 includes three contact heads, as shown in FIG. 18 and FIG. 19A. The wafer restraint modules 500 on the two sides of recess 24 are composed of the plurality of wafer restraint components 50 in arrangement. Each wafer restraint component 50 is aligned with the corresponding wafer restraint component 50 on the wafer restraint modules 500 on the other side of the recess 24, wherein each wafer restraint component 50 includes a base portion 51. One end of the base portion 51 is fixed on the inner surface 22 of the door 20, and another end is connected to a first bent arm 52, the first bent arm 52 including two free-ends. A first contact head 54 is formed at one of the two free-ends that is located farther from the central part of the recess 24; another free-end adjacent to the central part of the recess 24 further contacts the second bent arm 53; and the second bent arm 53 further includes a second contact head 55 and a third contact head 56.

Figure 19B:
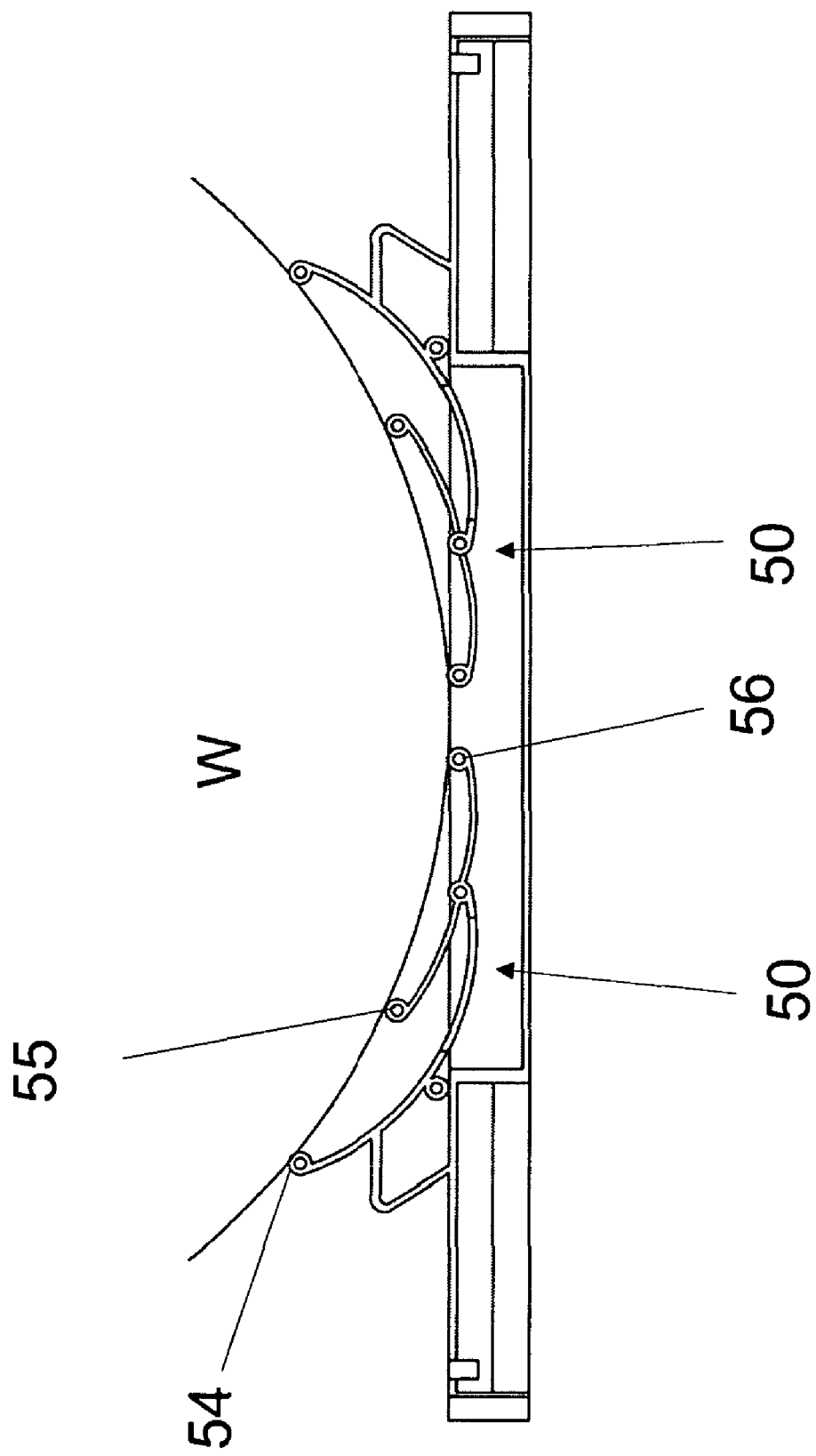
FIG. 19B is a view of the wafer restraint module of still another front opening unified pod (FOUP) of the present invention in the process of restricting the wafer.

The base potion 51 of the wafer restraint component 50 is an elastic structure (for example: thermal-elastic plastic structure) and includes a bent portion. Therefore when the door 20 is not yet joined with or about to be joined with the container body 10, the second bent arm 53 of the wafer restraint component 50 is horizontally attached or slightly suspended to the surface of or above the recess 24. Thus, the wafer is first contacted by the first contact head 54, and during the contact, the base portion 51 is deformed, and thus the included angle of the bent is changed and levered the first bent arm 52 and the second bent arm 53, which in turn make the second contact head 55 and the third contact head 56 on the second bent arm 53 contact the wafer. Meanwhile, as showing FIG. 19B, when the door 20 seals the container body 10, the second bent arm 53 is levered by the base portion 51 and the first bent arm 52 and driven far away from the surface of the recess 24. Thus, the first contact head 54, the second contact head 55, and the third contact head 56 of the wafer restraint component contact the wafer. Obviously, each wafer restraint component 50 provides three contact heads for supporting the wafer to more firmly restrict the wafer from moving toward the center of the opening or two sides of the opening of the wafer container. Certainly, in the present embodiment, a pivot 57 can be alternatively provided between the two free-ends of the first bent arm 52 and on one side of the inner surface 22 of the door 20, wherein the pivot 57 is fixed on the inner surface 22 of door 20. Thus, when the base portion 51 is deformed or the angle of the bent is changed, the first bent arm 52 and second bent arm 53 can be more firmly levered so that the first contact head 54, the second contact head 55, and the third contact head 56 can attach tightly to the wafer.

And as the abovementioned two embodiments of contact head, each of the plurality of wafer restraint components 50 can be an elastic integrated structure (for example: thermal-elastic plastic structure). The base portion 51 and the first bent arm 52 or second bent arm 53 can also be made of different materials or different elastic structure (for example, thermal-elastic structure), such as plastic with different hardness. Thus, bent arms would not be deformed easily due to the deformation of the base portion 51. Alternatively, the first contact head 54, the second contact head 55, and the third contact head 56 can include a recess so as the wafer is sunk into the recess to restrict the wafer from moving up and down. The plurality of wafer restraint components 50 as described above can also be formed on a base portion, and the base portion is firmly disposed on the inner surface 22 of the door 20. Alternatively, the plurality of wafer restraint components 50 are integrated with the inner surface 22 of the door 20.

Furthermore, the inner surface 22 of door 20 of the present invention can be a plane surface without recess; at least a latch component 60 can be disposed between inner surface 22 and outer surface 21, and a latch component 60 is disposed in one preferred embodiment. The latch component 60 is the same as what is described in the aforementioned embodiment so will not be described in detail. In addition, in order for the plurality of wafers in the container body 10 can be fixed when the door 20 closes the container body 10, thus at least a restraint module can be disposed on inner surface 22 of above-mentioned plane surface or near the central area of above-mentioned plane surface. And the structure or the form of this restraint module is not limited in the present invention, therefore structures such as above-mentioned restraint module 30, restraint module 400, restraint module 500, or other similar structures can all be included in the present invention. Similarly, the restraint module is the same as what is described in the aforementioned embodiment so the specifics of the structure will not be described in detail.

Obviously, the latch component 60 of the present invention is driven by oval cam 62 that can only make to-and-fro movement, moving forward and backward, and no shift will occur on the longitudinal (vertical) direction. Therefore, the latch component 60 of the present invention is a simpler design. When the door 20 closes to the container body 10 of the present invention, the plurality of wafer restraint components 50 fixed on inner surface 22 of door 20 and the plurality of wafer restraint components 50 contacts the plurality of wafers directly. A pair of moving bars 64 are driven by the cam 62 to move toward the edge of door 20, which makes the front plane 646 of moving bars 64 to go through the latch hole 27 on the door 20 and the pair of moving bars 64 is fastened in the socket hole 13 corresponding to the latch hole 27 near the edge of opening of container body 10. Then, an aeration device can be disposed for aerating air-tight component (not shown in Figure) between the door 20 and the container body 10 to isolate the interior from the exterior of container body 10.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container including a container body that having a plurality of slots therein for receiving a plurality of wafers and an opening formed by a sidewall of said wafer container for exporting said plurality of wafers or importing said plurality of wafers, at least a pair of socket holes being disposed at one edge of said opening of said container body; and a door with an outer surface and an inner surface with at least a pair of latch holes corresponding to each said pair of socket holes being disposed at one edge of said door, said door joining with said opening of said container body via said inner surface for protecting said plurality of wafers in said container body, the characteristic of said wafer container is that:

a recess is disposed on said inner surface of said door and located between two platforms, and each of said two platforms is disposed with a latch component, each said latch component including an oval cam, a pair of moving bars and one end of said respective moving bar contacting said oval cam, at least a pair of rollers disposed in each of said two platforms of said door and a respective said roller fixed in a slide groove of said respective moving bar, and a locating spring being an integral part of said respective moving bar for controlling the turning of said oval cam to drive said respective moving bar to move to and fro between said pair of socket holes and each said pair of latch holes.

2. The wafer container according to claim 1, further comprising a locating roller disposed on said end of said respective moving bar and said locating roller contacts said oval cam.

3. The wafer container according to claim 1, further comprising a plurality of locating grooves disposed on said oval cam.

4. The wafer container according to claim 1, wherein the material of said oval cam is selected from the group consisting of: metal and polymer plastic material.

5. The wafer container according to claim 1, wherein the material of each said moving bar is selected from the group consisting of: metal and polymer plastic material.

6. The wafer container according to claim 1, wherein the material of said locating spring is selected from the group consisting of: metal and polymer plastic material.

7. The wafer container according to claim 1, wherein the material of each said pair of rollers is selected from the group consisting of: metal and polymer plastic material.

8. The wafer container according to claim 1, further comprising at least a restraint module are disposed respectively on a respective one of said two platforms.

9. The wafer container according to claim 8, wherein each said restraint module includes a base portion for fixing each said restraint modules on each of said two platforms with said base portion, and a plurality of curve portions is formed with a space at interval on a longer side of said base portion, a semicircle-shape protruding portion being formed between each said curve portions and its free-end, and a guide notch being disposed on each said semicircle-shape protruding portion of each said restraint module for contacting said plurality of wafers.

10. The wafer container according to claim 9, wherein a wear-resisting material is coated on a contact area between said guide notch of said protruding portions and said plurality of wafers.

11. A wafer container including a container body that having a plurality of slots therein for receiving a plurality of wafers and having an opening formed by a sidewall of said wafer container for exporting said plurality of wafers or importing said plurality of wafers, at least a pair of socket holes being disposed at one edge of said opening of said container body;

and a door with an outer surface and an inner surface with at least a pair of latch holes corresponding to each said pair of socket holes being disposed at one edge of said door, said door joining with said opening of said container body via said inner surface for protecting said plurality of wafers in said container body, the characteristic of said wafer container is that:

at least one latch component is disposed between said inner surface and said outer surface of said door, each said latch component including an oval cam, a pair of moving bars and one end of said respective moving bar contacting said oval cam, at least a pair of rollers disposed between said inner surface and said outer surface of said door and each said roller fixed in a slide groove of a respective said moving bar, and a locating spring being an integral part of said respective moving bar for controlling the turning of said oval cam to drive said respective moving bar to move to and between each said pair of socket holes and each said pair of latch holes.

12. The wafer container according to claim 11, further comprising a locating roller disposed on one end of each said moving bar.

13. The wafer container according to claim 11, further comprising a plurality of locating grooves disposed on said oval cam.

14. The wafer container according to claim 11, wherein the material of said oval cam is selected from the group consisting of metal and polymer plastic material.

15. The wafer container according to claim 11, wherein the material of each said moving bar is selected from the group consisting of metal and polymer plastic material.

16. The wafer container according to claim 11, wherein the material of said locating spring is selected from the group consisting of metal and polymer plastic material.

17. The wafer container according to claim 11, wherein the material of each said rollers is selected from the group consisting of metal and polymer plastic material.

18. The wafer container according to claim 11, further comprising at least a restraint module is disposed on said inner surface of said door.

* * * * *